(12) United States Patent
Klipstein et al.

(10) Patent No.: US 9,613,999 B2
(45) Date of Patent: Apr. 4, 2017

(54) SEMICONDUCTOR DEVICE

(71) Applicant: Semi Conductor Devices—an Elbit Systems—Rafael Partnership, Haifa (IL)

(72) Inventors: Philip Klipstein, Zikhron Ya'akov (IL); Olga Klin, Yoqneam Illit (IL); Eliezer Weiss, Ramat Yishai (IL)

(73) Assignee: SEMI CONDUCTOR DEVICES—AN ELBIT SYSTEMS-RAFAEL PARTNERSHIP, Haifa (IL)

( * ) Notice: Subject to any disclaimer, the term of this patent is extended or adjusted under 35 U.S.C. 154(b) by 0 days.

(21) Appl. No.: 15/099,492

(22) Filed: Apr. 14, 2016

(65) Prior Publication Data

US 2016/0307956 A1    Oct. 20, 2016

(30) Foreign Application Priority Data

Apr. 19, 2015    (IL) .......................................... 238368

(51) Int. Cl.
*H01L 27/00*     (2006.01)
*H01L 31/00*     (2006.01)
*H01L 27/146*    (2006.01)
*H01L 31/0352*   (2006.01)
*H01L 31/09*     (2006.01)
(Continued)

(52) U.S. Cl.
CPC .... *H01L 27/14649* (2013.01); *H01L 27/1462* (2013.01); *H01L 27/14629* (2013.01); *H01L 27/14634* (2013.01); *H01L 27/14636* (2013.01); *H01L 27/14698* (2013.01); *H01L 31/02161* (2013.01); *H01L 31/03046* (2013.01); *H01L 31/035236* (2013.01); *H01L 31/09* (2013.01); *H01L 31/108* (2013.01); *H01L 31/109* (2013.01); *H01L 31/1868* (2013.01)

(58) Field of Classification Search
CPC ......... H01L 27/14698; H01L 27/14649; H01L 27/14636; H01L 27/14629; H01L 27/14634; H01L 27/1462; H01L 31/02161; H01L 31/109; H01L 31/1868; H01L 31/03046; H01L 31/035236; H01L 31/09; H01L 31/108
See application file for complete search history.

(56) References Cited

U.S. PATENT DOCUMENTS 4,679,063 A    7/1987  White
7,687,871 B2   3/2010  Maimon
(Continued)

OTHER PUBLICATIONS

Arias et al. "Planar p-on-n HgCdTe Heterostructure Photovoltaic Detectors", Applied Physics Letters 62 (9), 976-978 (1993).
(Continued)

*Primary Examiner* — Nikolay Yushin
(74) *Attorney, Agent, or Firm* — Dorsey & Whitney LLP

(57) ABSTRACT

A semiconductor device is disclosed, which includes: at least one a device layer being a crystallized layer for example including: a superlattice layer and/or a layer of group III-V semiconductor materials; and a passivation structure comprising one or more layers wherein at least one layer of the passivation structure is a passivation layer grown in-situ in a crystallized form on top of the device layer, and at least one of the one or more layers of the passivation structure includes material having a high density of surface states which forces surface pinning of an equilibrium Fermi level within a certain band gap of the device layer, away from its conduction and valence bands.

24 Claims, 17 Drawing Sheets

(51) Int. Cl.
H01L 31/108 (2006.01)
H01L 31/18 (2006.01)
H01L 31/0216 (2014.01)
H01L 31/0304 (2006.01)
H01L 31/109 (2006.01)

(56) References Cited

U.S. PATENT DOCUMENTS

| | | |
|---|---|---|
| 7,795,640 B2 | 9/2010 | Klipstein |
| 8,004,012 B2 | 8/2011 | Klipstein |
| 2010/0230720 A1 | 9/2010 | Wicks |
| 2012/0273838 A1 | 11/2012 | Kinch et al. |
| 2014/0191195 A1 | 7/2014 | Sundaram et al. |

OTHER PUBLICATIONS

Barton, J., et al., "InGaAs NIR Focal Plane Arrays for Imaging and DWDM Applications", Proceedings of SPIE 4721, 37 (2002).
Editors Hellwege, K.H. and Madelung, O., Landolt-Börnstein New Series, Group III, "Physics of Group IV Elements and III-V Compounds", vol. 17a, (Berlin: Springer, 1982), p. 273.
Klipstein, P.C., "XBnn and XBpp Infrared Detectors", Journal of Crystal Growth (2015) (doi:10.1016/ j.jcrysgro.2015.02.075).
Klipstein et al., "High Operating Temperature XBn-InAsSb Bariode Detectors", Proceedings of SPIE 8268, 8268-0U (2012).
Livneh et al, "K•p Model for the Energy Dispersions and Absorption Spectra of InAs/GaSb Type-II Superlattices", Physical Review B 86, 235311 (2012).
Maimon, S. and Wicks, G. W., "nBn Detector, an Infrared Detector with Reduced Dark Current and Higher Operating Temperature", Applied Physics Letters 89, 151109 (2006).
Rehm et al., "Passivation of InAs/(GaIn)Sb Short-period Superlattice Photodiodes with 10[mu]m Cutoff Wavelength by Epitaxial Overgrowth with AlxGa1-xAsySb1-y", Applied Physics Letters 86, 173501 (2005).
Rutkowski, J., "Planar Junction Formation in HgCdTe Infrared Detectors", Opto-electronics Review 12, 123-128 (2004).
Schuster and Bellotti, E., "Numerical Simulation of Quantum Efficiency and Surface Recombination in HgCdTe IR Photon-trapping Structures", Proceedings of SPIE 8704, Infrared Technology and Applications XXXIX, 87042Q (Jun. 18, 2013).
Stradling, R. A., and Klipstein, P.C., "Growth and Characterisation of Semiconductors", p. 171-173 (section 4), 1990.
Sze, S. M. "Physics of Semiconductor Devices", (J. Wiley and Sons, 2nd edition), p. 251, Jan. 1998.
Vurgaftman, I., et al, "Band Parameters for III-V Compound Semiconductors and Their Alloys", Journal of Applied Physics 89 (11) (Jun. 1, 2001).
Plis, et al., "InAs/GaSb strained layer superlattice detectors with nBn design", Infrared Physics and Technology, vol. 52, No. 6, 1 Nov. 2009, pp. 335-339.
Inada, et al., "Pretreatment for surface leakage current reduction in type-II superlattice MWIR photodetectors", Optomechatronic Micro/Nano Devises and Components III; Oct. 8-10, 2007, Lausanne, Switzerland, SPIE, vol. 9070, Jun. 24, 2014, pp. 90700Z-1—90700Z-6.
European Search Report from European Application No. 16165122.9 dated Oct. 4, 2016.

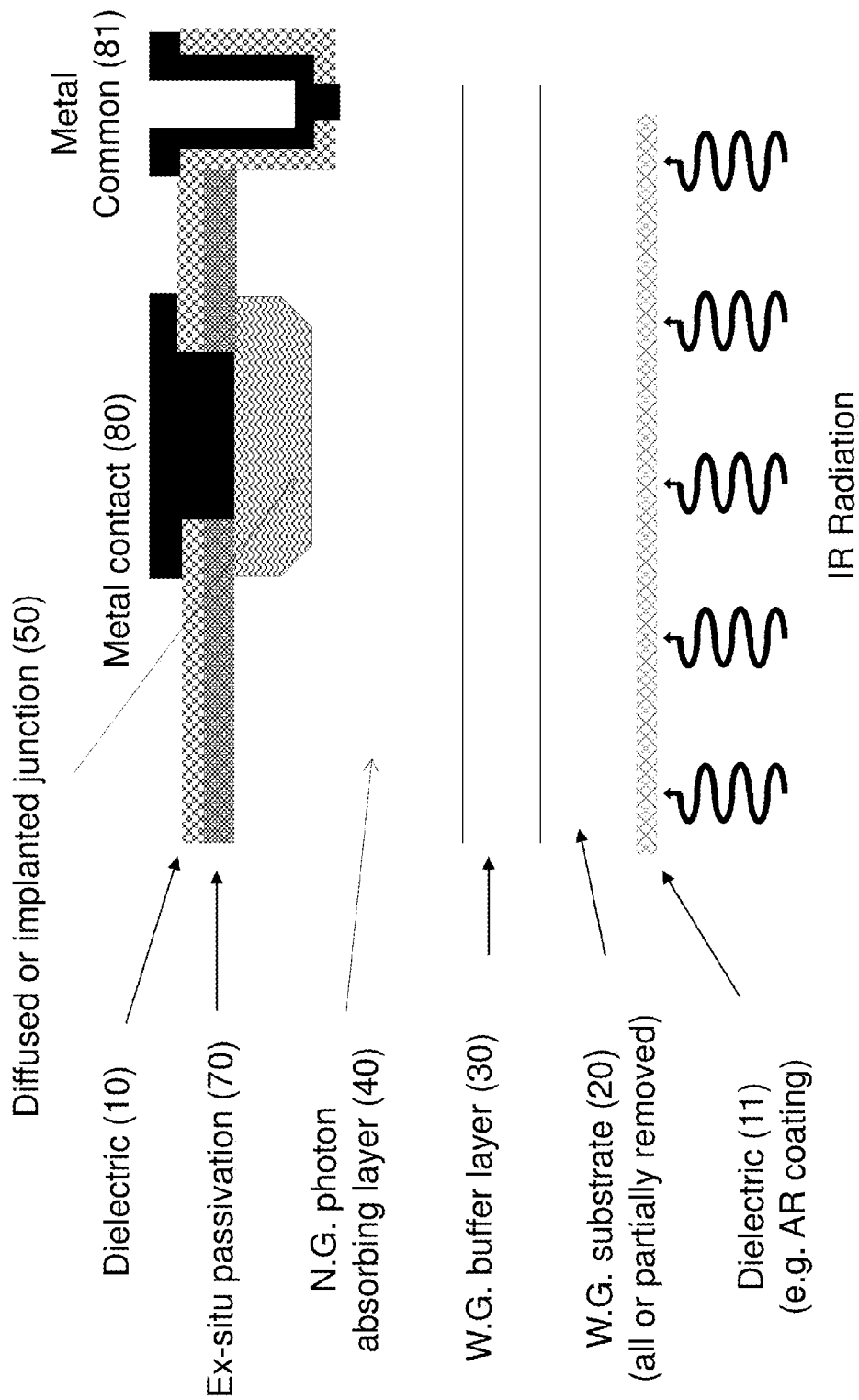

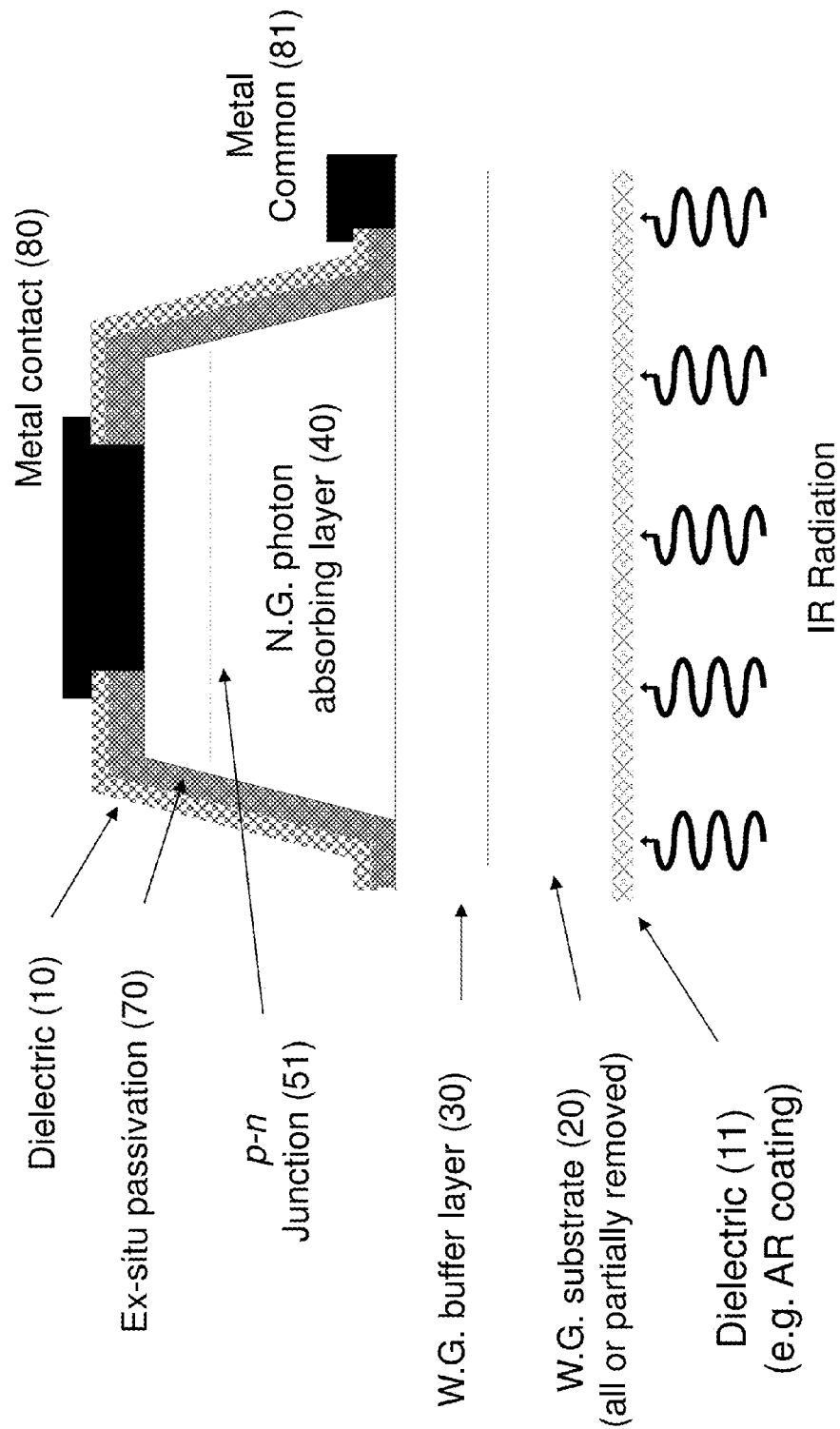
Fig 1B (General art)

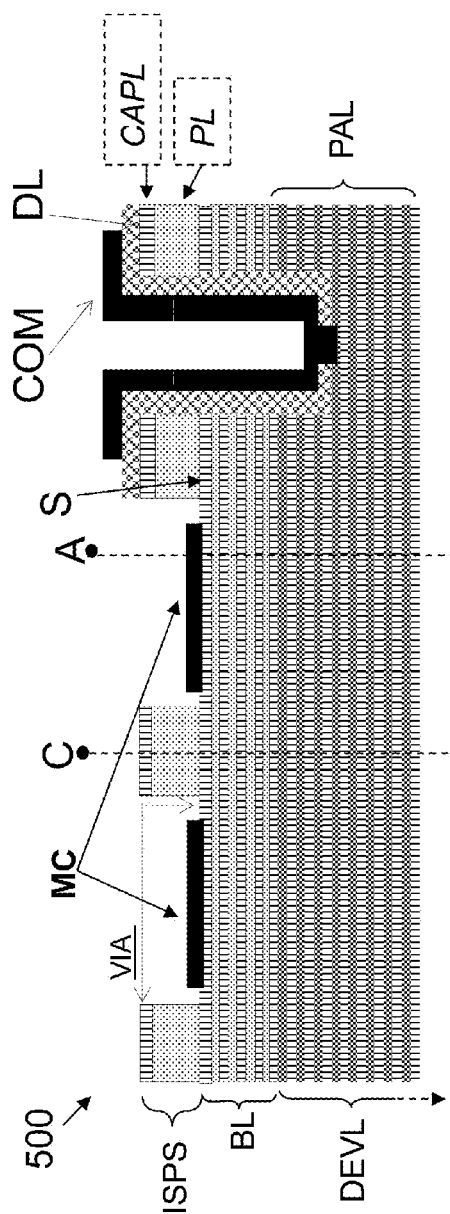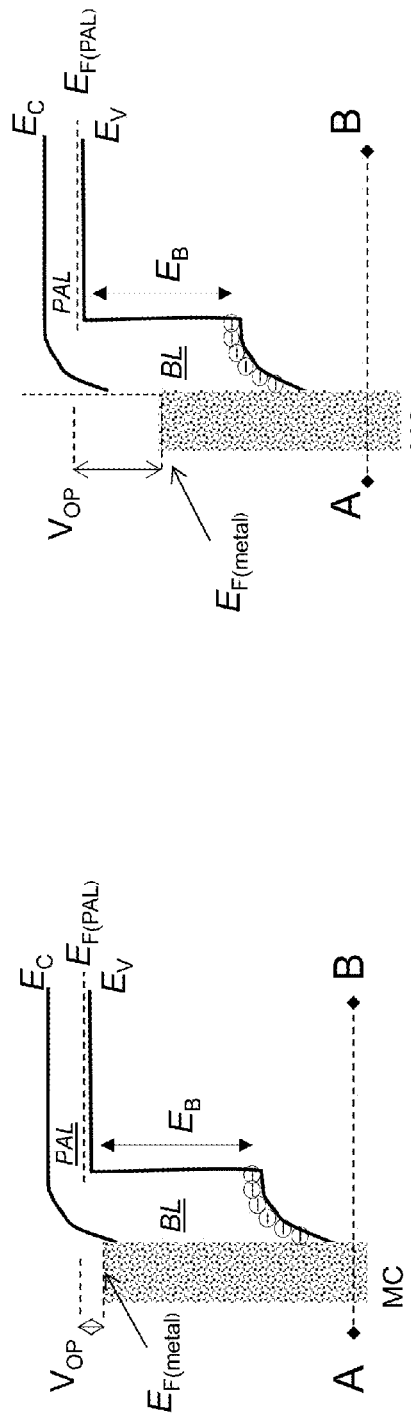
Fig. 3A
Fig. 3B
Fig. 3C

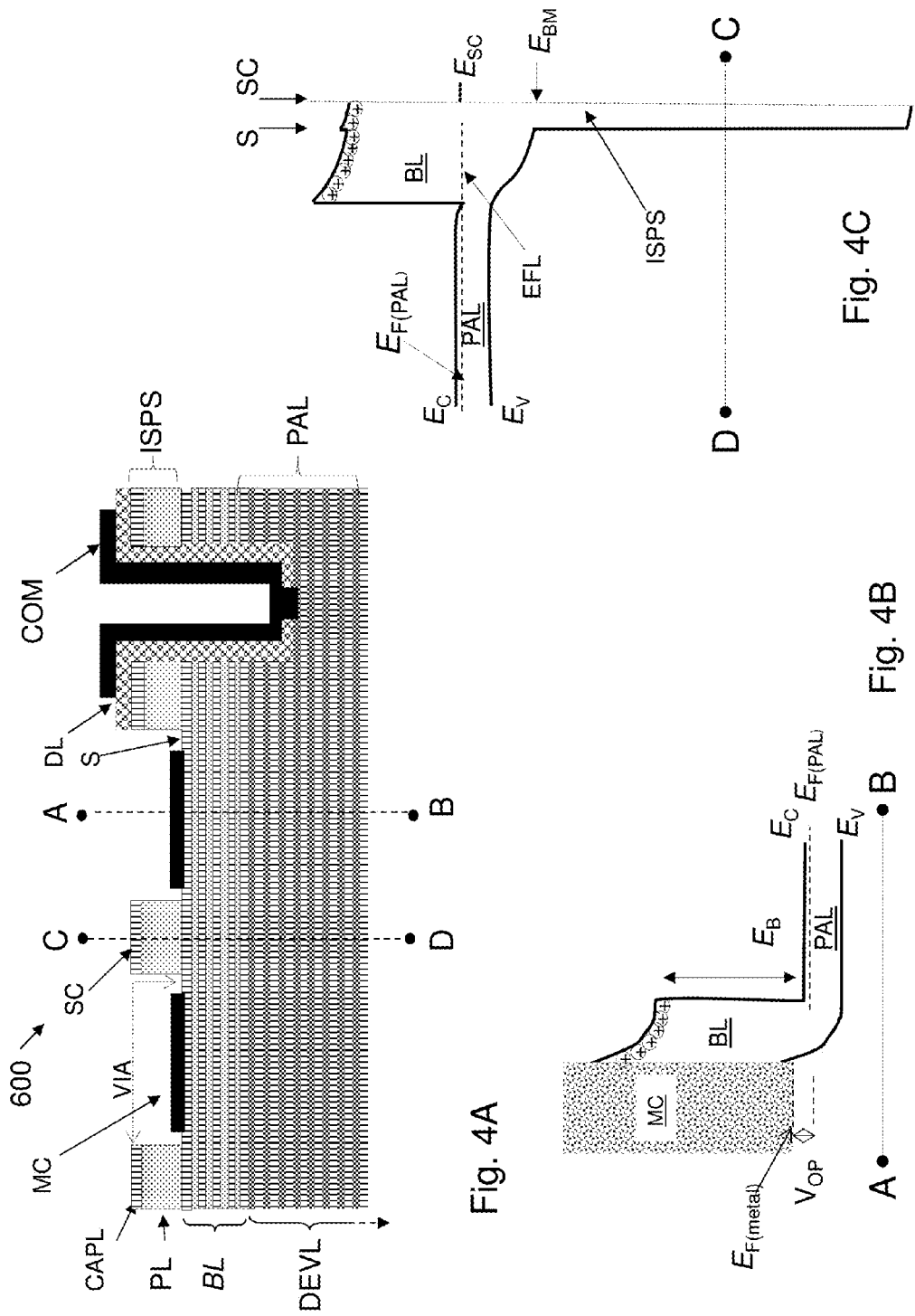

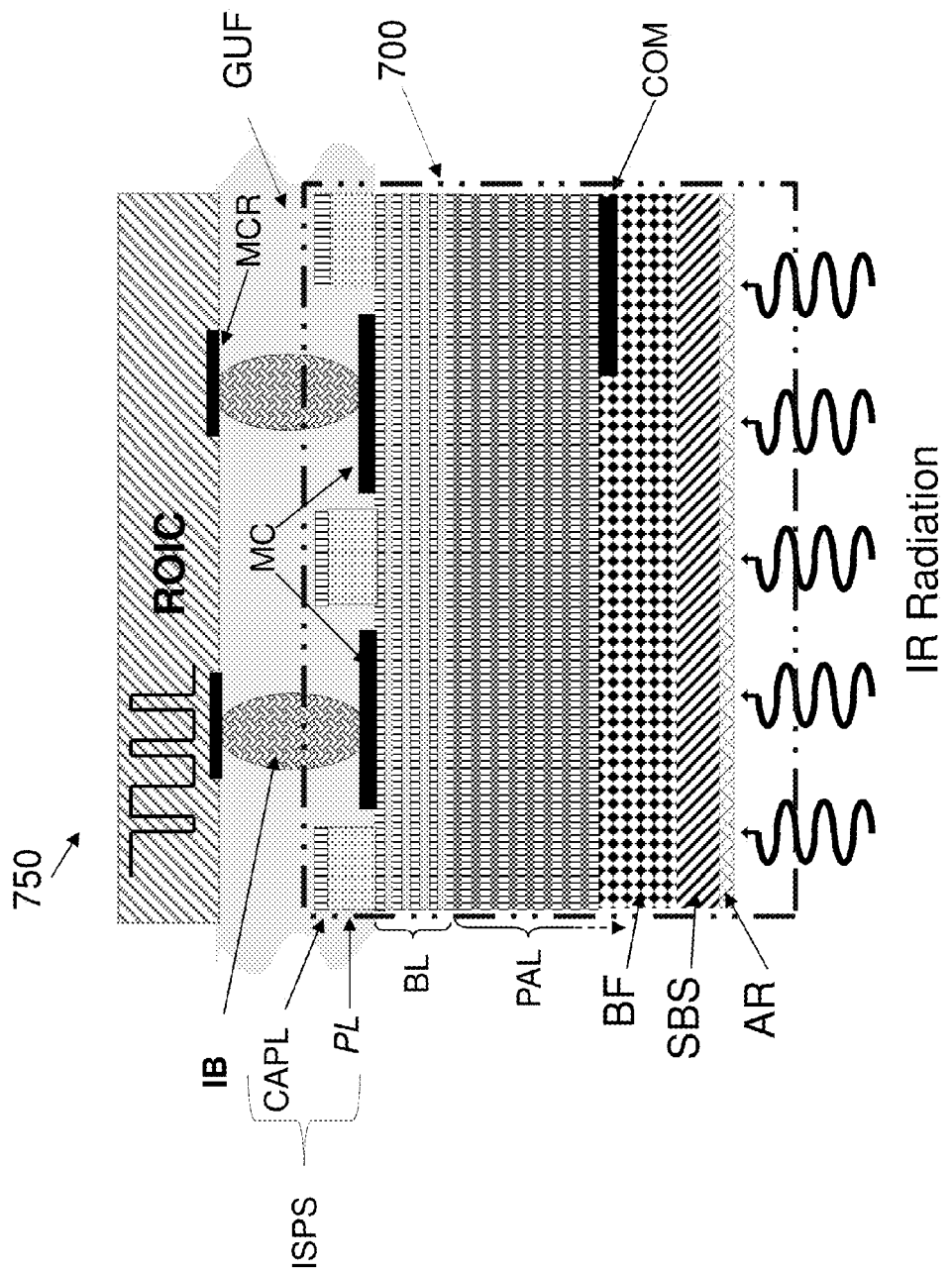

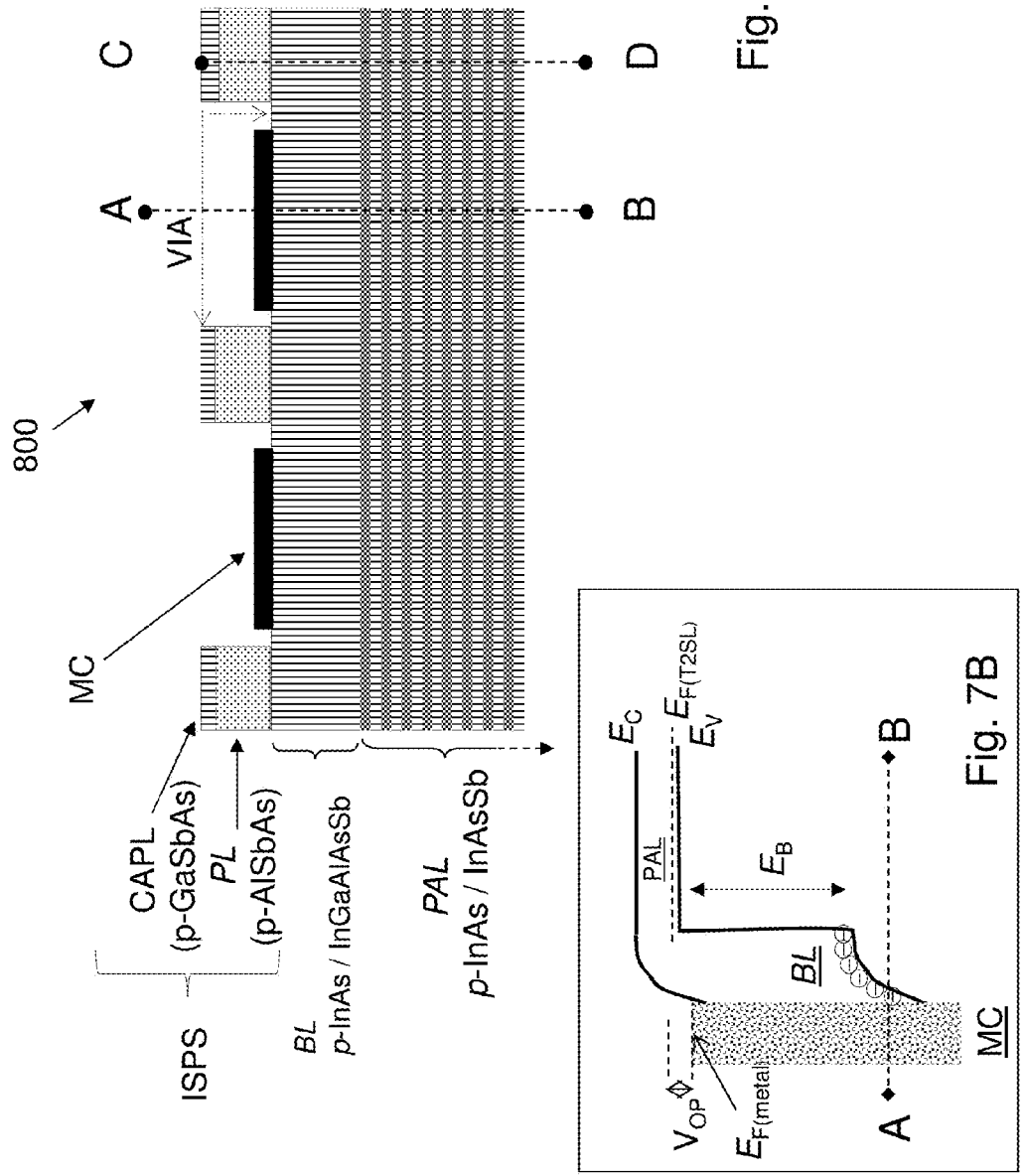

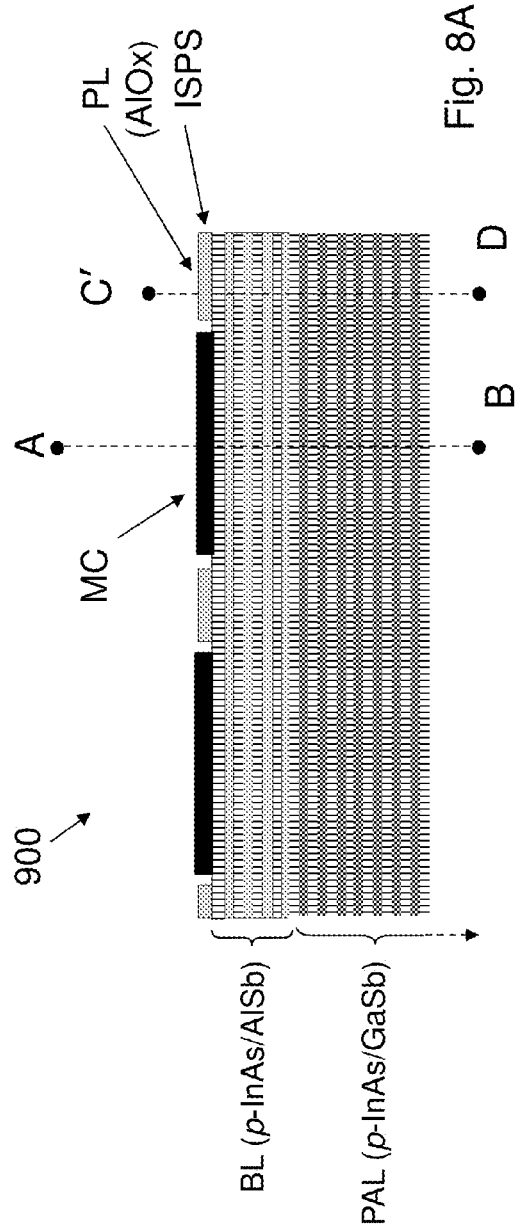
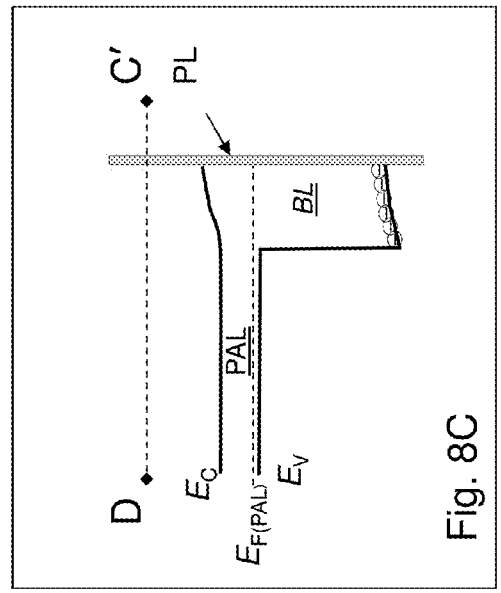
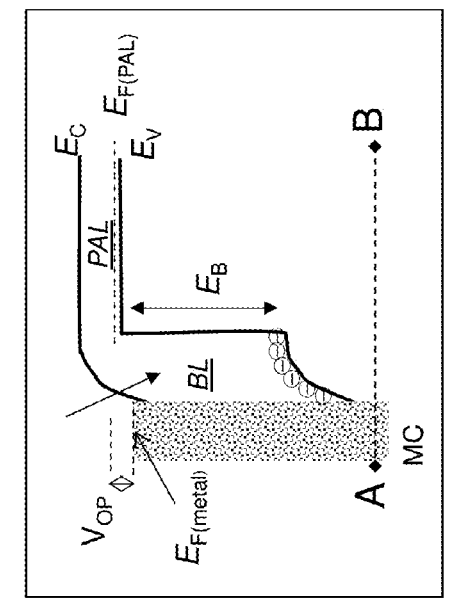
Fig. 8A
Fig. 8B
Fig. 8C ial Patent Application No. 238368 filed on 19 Apr. 2015, the disclosure of
SEMICONDUCTOR DEVICE

CROSS-REFERENCE TO RELATED APPLICATIONS

This application claims priority to Israel Patent Application No. 238368 filed on 19 Apr. 2015, the disclosure of which is incorporated herein, in its entirety, by this reference.

TECHNOLOGICAL FIELD

The present invention relates to semiconductor devices, and pore particularly, relates to passivation of a photodetector structure to reduce cross conduction between pixels.

REFERENCES

References considered to be relevant as background to the presently disclosed subject matter are listed below:
  [01] U.S. Pat. No. 7,795,640 (Klipstein, 2003)
  [02] U.S. Pat. No. 8,004,012 (Klipstein, 2006)
  [03] J. Rutkowski, Opto-electronics Review 12, 123 (2004))
  [04] Rehm et al., Applied Physics Letters 86, 173501 (2005)
  [05] Arias et al. in Applied Physics Letters 62, 976 (1993)
  [06] J. Barton et al., Proceedings of SPIE 4721, 37 (2002)
  [07] Klipstein et al., Proceedings of SPIE 8268, 8268-0U (2012).
  [08] P. C. Klipstein, Journal of Crystal Growth (2015) (doi:10.1016/j.j crysgro.2015.02.075),
  [09] S. Maimon and G. W. Wicks, Applied Physics Letters 89, 151109 (2006)
  [10] U.S. Pat. No. 7,687,871 (S. Maimon, 2006)
  [11] U.S. Pat. No. 4,679,063 (A. White 1983)
  [12] Livneh et al, Physical Review B 86, 235311 (2012)
  [13] R. A. Stradling and P. C. Klipstein, Growth and Characterisation of Semiconductors, p171 (section 4)
  [14] I. Vurgaftman et al, Journal of Applied Physics 89 (2001), FIG. 11 on p5855
  [15] U.S. patent application 2012/0273838 A1 (M. A. Kinch, C. A. Schaake, filed 2011)
  [16] S. M. Sze "Physics of Semiconductor devices" (J. Wiley and Sons, $2^{nd}$ edition), p251
  [17] Physics of Group IV Elements and III-V Compounds, Landolt-Bornstein New Series, Group III, Vol. 17a, ed. K. H. Hellwege and O. Madelung (Berlin: Springer, 1982), p. 273
  [18] J. Schuster and E. Bellotti, Proceedings of SPIE 8704, 87042Q (2013)

Acknowledgement of the above references herein is not to be inferred as meaning that these are in any way relevant to the patentability of the presently disclosed subject matter.

BACKGROUND

Photodiodes are widely used for sensing light radiation. There are many applications in which the level of light which is required to be sensed is very low, and therefore the sensitivity of said photodiodes is a critical requirement.

It is well known in the art that the signal-to-noise ratio which can be obtained from photodiodes (and from many other electronic components) is limited by the level of the "thermal noise", which in turn is related to the temperature of the component. The term "dark current" is commonly used in the art to define the current flowing in a photodiode during a total dark condition. The signal-to-noise ratio in photodiodes is conventionally improved by cooling the component, in some cases down to very low temperatures close to 0° K. The means for cooling and maintaining such a low temperature in photodiodes, however, are cumbersome and expensive, and in any case can only reduce the noise down to a limited value.

In an ideal photodiode, the dark current is generally composed of two main components. The first component, hereinafter referred to as "the diffusion" dark current, is due to the thermal excitation of carriers across the complete energy band gap of the photon absorbing material of the photodiode, followed by diffusion of minority carriers thus created to the depletion region. The second component affecting the level of the dark current is known as the "Generation-Recombination" current, hereinafter referred to as "G-R" dark current. A reverse bias applied to the diode activates these G-R centers in the depletion region of the photodiode, so that they can provide energy levels close to the middle of the band gap. As a result, the amount of thermal energy or "activation energy" needed to excite an electron (charge carrier) in the depletion region from the valence band to the conduction band is approximately halved compared with the diffusion current process. Moreover, when electron-hole pairs are generated in this way, they are immediately removed by the electric field of the depletion region, thereby providing a strong driving mechanism for the G-R current. While the level of the G-R dark current can also be reduced by cooling, it is reduced at a slower rate than the diffusion current, due to its smaller activation energy. At low temperatures, where the level of the diffusion dark current is reduced sufficiently, the G-R dark current generally becomes the most dominant component of the dark current. There have been made many efforts in trying to reduce the level of the thermal noise. However, there are not known many such efforts for reducing the G-R current.

In a real photodiode, there is often a third component to the dark current which is parasitic in nature. This component is due to an unwanted surface leakage current which acts to shunt the resistance of the depletion region of the device. This current is often relatively insensitive to temperature and thus cannot be totally eliminated by cooling the device. It is usually suppressed by applying an appropriate passivation treatment to the exposed surfaces of the device in the junction region but the effectiveness of this treatment can vary according to the materials used.

In widely used III-V infra-red detector photodiodes based on materials such as InSb, which is well matched to the mid-wave infra-red (MWIR) atmospheric transmission window (approximately 2.9-5.4 μm), the dark current is invariably due to the G-R mechanism. Recently, new types of photodetectors have been demonstrated in which heterostructures are used to increase the band gap of the depletion region at a barrier layer of the photodetector. As a result, the G-R current is strongly suppressed so that the diffusion current becomes dominant. The dark current noise of the detector is then very low. These devices are often referred to as XBn or XBp detectors.

The XBn and XBp photo-detectors relate to a class of infra-red photo-detectors developed as an alternative to traditional photodiode detectors currently incorporated into many infrared detector systems. Four different architectures were proposed for the XBn or XBp photo-detectors in U.S. Pat. Nos. 7,795,640 and 8,004,012 assigned to the assignee of the present application. Detectors of the XBn/XBp detector family include: a photon absorbing layer, a barrier layer, and a contact layer on top of which metal contacts, to be connected to a suitable readout circuit, may be placed. In XBn/XBp detectors, the photon absorbing layer and barrier layer have the same doping polarity (n-type in XBn devices and p-type in XBp devices), so that a depletion layer is not formed at the junction between the barrier layer and the photon absorbing layer (see [08]). In XBn photodetectors, the barrier layer is constrained to have both a negligible valence band energy offset (e.g., less than a few $k_B T_{op}$ where $k_B$ is Boltzman's constant and $T_{op}$ is the detector operating temperature) and a large conduction band energy offset (e.g., equal to, or larger than, the band gap of the photon absorbing layer) with the photon absorbing layer, and the valence band of the contact layer lies close to or above the valence band of the barrier layer. XBp photodetectors are the polarity reversed version of XBn photodetectors, having also an inverted band structure. Accordingly, in XBn/XBp photodetectors, majority carriers in the contact layer are prevented from entering the barrier layer by a large energy barrier, while at the operating bias of such detectors, minority carriers in the photon absorbing layer (holes in XBn and electrons in XBp) can diffuse freely into the barrier layer, from which they drift into the contact layer under the influence of the electric field in the depleted barrier layer. XBn/XBp devices are generally designed to have no depletion of the photon absorbing layer (e.g., since both the photon absorbing and barrier layers have the same doping polarity) such that G-R currents are suppressed and the main source of dark current is constituted by diffusion current. The dark current in such XBn/XBp devices is therefore lower than the dark current in a conventional photodiode made from the same photon absorbing material. In [07] band structures of the XBn and XBp photodetector devices are described.

Detectors known as nBn/pBp present a particular case of the XBn/XBp photodetector in which the contact layer is made from the same material as the photon absorbing layer and is doped with the same polarity. References [09] and [10], disclose versions of detectors that include a photon absorbing layer, a barrier layer and a contact layer, where the barrier layer is undoped. In the XBn/XBp configurations described above, it is doped with the same doping polarity as the photon absorbing layer. A device/detector with an undoped barrier can often have a background doping in the barrier layer which is opposite to that of the photon absorbing layer (i.e., p-type barrier in XBn and n-type barrier in XBp), and which will form a depletion region sourcing G-R current from the photon absorbing layer and so the dark current from such devices will not be diffusion limited as in the case of the XBn devices described above.

U.S. patent publication 2012/0273838 describes minority carrier based HgCdTe infrared detectors and arrays.

U.S. Pat. No. 4,679,063 proposes an alternative design of barrier structure (hereinafter referred to as an mBn structure) in which the barrier layer has the opposite doping polarity to the photon absorbing layer, and the contact layer is replaced/formed by metal.

GENERAL DESCRIPTION

There is a need in the art for a novel integrated semiconductor device (such as a photodetector) and a method of its manufacture utilizing a novel approach for passivation of an integrated structure, to prevent/reduce surface current leakage associated with "poor electric isolation" (e.g., cross conduction) between different components (e.g., pixels/modules) of the integrated device.

In this connection, the following should be understood. The success of the above-described XBn or XBp detector architecture depends on the absence of any surface leakage currents, so that the diffusion current remains the dominant dark current component. Surface passivation is generally used to prevent/reduce surface conduction and leakage.

The most common approach to passivation is ex-situ deposition of a passivation material, which is performed after the growth of the crystallized semiconductor layers of the semiconductor device. Examples are shown in FIGS. 1A and 1B. In the case of a photodiode, this means that the p-n junction is defined in the narrow band gap photon absorbing layer 40 either by ion implantation or atomic diffusion through a lithographically prepared mask (50 in FIG. 1A), or by epitaxial growth of the junction followed by etching of a mesa structure, again using a lithographically prepared mask (51 in FIG. 1B). A first passivation material 70 is deposited on the exposed edges of the junction. If ion-implantation is used to define the junction, it is sometimes performed by implanting through the passivation material. A dielectric layer 10 is often deposited on top of the first passivation layer and it serves either as part of the passivation (together with the first passivation layer) or as protection of the first passivation layer against reaction with the external atmosphere. Examples of passivated diode structures manufactured by a method similar to that of FIGS. 1A and 1B are respectively demonstrated in articles [3] and [4]).

Some semiconductor hetero-structure techniques (see [5] and [6]) include a p-n junction 50 that is-formed by diffusion or implantation of impurities via a mask through the wide band gap layer, which serves for passivation.

When no diffusion or implantation of a junction is used in the case of an XBn/XBp device, a technique used to isolate individual XBn/XBp devices/modules (suppress/prevent surface leaks/currents) is the etching of mesas through the contact layer (e.g., see [01] and [02]). [10] and [02] disclose devices in which the etching stops at the barrier layer. In this case, a need for a passivation layer/structure may be obviated, if the barrier layer acts as its own passivation layer that suppresses/prevents surface leakage/currents. However, in cases where the surface states of the exposed barrier layer are such that it has an accumulated or inverted surface which attracts free carriers, the barrier layer is unable to perform a passivation function and an additional passivation layer/structure is needed.

Thus, ex-situ passivation is conventionally used to passivate surfaces of an integrated structure/device, after the fabrication/deposition of the crystallized layers of the device in a growth chamber (e.g., in which the layers are grown by an epitaxial growth method such as molecular beam epitaxy) and the fabrication of the functional device junction. However, in some cases, the technique of ex-situ passivation is less suitable and may provide poor results, because a suitable material cannot be found with the appropriate adhesion properties and with the appropriate distribution of bulk and surface states that can prevent surface conduction.

The present invention is based on the inventor's understanding of the following. Surface current leaks may generally be prevented/reduced if the equilibrium Fermi level at exposed/etched surfaces of the device layer structure is pinned in the band gap region of the device layer structure. Here, the term device layer(s) or device layer structure is used to designate a structure formed by one or more functional layers, such as a barrier layer, a photon absorbing layer, etc. Such pinning of the equilibrium Fermi level prevents/reduces surface current leakage because in such cases the device layer structure might act as its own passivation. However, in cases where the equilibrium Fermi level at exposed/etched surfaces of the device layer structure (e.g., between mesas) is not pinned in the band gap region (which may be a result of the use of glue under-fill), the exposed/etched surfaces might conduct/leak current (e.g., formed mesas will not be sufficient to isolate between different modules/pixels of the integrated device or to stop leakage to a common contact), and in such cases an additional passivation treatment/structure/layer might be needed.

Therefore, the present invention provides a novel technique for in-situ passivation of integrated devices, and particularly for passivating devices at which the metal contacts are electrically connected to a barrier layer of the device layer structure having a relatively large band gap. It should be understood that generally, here and in the following, the term in-situ (specifically in relation to in-situ growth of layers, and/or when referring to an in-situ passivation layer) is used to indicate layers of a semiconductor device/structure, which are grown (crystallized) (e.g., by Molecular Beam Epitaxy (MBE)) on top of other grown layers, before removing the material from the Molecular Beam Epitaxy (MBE) growth machine. It should also be noted that the terms relating to layer growth relate to the growth of crystallized layers of material (being layers of semiconductor material or not).

It should be noted that the use of in-situ grown passivation layers and/or a passivation layer structure (herein after also termed passivation structure) is specifically important for passivating superlattice layers, such as type II superlattices (T2SLs) and/or for passivating layers of semiconductor materials of type/group III-V. The latter, type/group III-V materials, may include semiconductor alloys with combinations of one or more of Indium, Gallium and Aluminum (In, Ga and Al) from group III of the periodic table with one or more of Antimony and Arsenic (Sb and As) from group V, which may also be fabricated to form superlattice layers (such as T2SLs with predesigned energy band structures). The phrase passivation herein should be understood as relating to electric passivation of the surface/interface of a semiconductor layer aimed at reducing preventing electric conduction through the surface/interface (e.g., prevent surface currents), and possibly in some cases it also relates to protection of the surface/interface from oxidation/degradation in an external atmosphere.

Type/group III-V semiconductor materials, in many cases formed as T2SLs, are in many cases used in the fabrication of photo-detector arrays (herein after photo-detectors) due to the ability to design the band structure of photon absorbing layers of such detectors and absorb desired wavelengths, to which the detector should be sensitive. As indicated above, isolation of the different detector modules (pixels) in such photo-detectors is achieved by deposition/growth of a conducting contact layer, and etching the contact layer to form electrically isolated mesas on to which the metal contact pads are attached.

However, an important advantage of devices in which the contact layer is replaced/formed by metal, such as the mBn device disclosed in U.S. Pat. No. 4,679,063, is that it is not necessary to grow a contact layer on top of the device layers (such as on top of the barrier layer), and deposit metal contacts/pads thereon. Instead, the contact metal/pads are deposited directly onto the upper device layer (e.g., on top of the barrier layer). This obviates a need to define individual devices (e.g., pixels) by etching a mesa structure through all of the contact layer, as would generally be necessary with, for example, an nBn structure.

However, in order to obviate the need for using a contact layer and/or for etching mesas, a suitable and reliable technique for passivating the device layer(s) (at least the top one; e.g., the barrier layer of some photo-detector devices) is needed. This is specifically important when considering semiconductor devices in which the device layer(s) (at least the top one) is a T2SL layer and/or includes type/group III-V semiconductor materials. This is because techniques of passivating such materials and/or superlattice structures are currently lacking. This is specifically true for photo-detector devices, such as cooled Infra-Red photo-detectors, in which the energy band structure or surface potential of exposed surfaces may be affected by a glue under-fill which is used in between the readout-circuit ROIC of the device and the semiconductor layers and/or in which large stresses/shear stresses are present (e.g., caused by thermal expansion coefficient mismatch between the ROIC and the semiconductor layers, and possibly also between these and the glue under-fill itself). This is because changes in the energy band structure and/or surface potential caused by such effects may impair the operation of the conventional passivation technique used and thereby lead to deteriorated device performance.

Some known photo-detector devices (e.g., see U.S. patent publication 2012/0273838) use a barrier layer and a photon absorbing layer both made of semiconductor HgCdTe material, and having the same n-doping polarity, and a contact layer deposited on the barrier layer and made from the same material family HgCdTe with lower amounts of Cd (e.g., lower than 15%) and with a metal contact on top which has good adhesive qualities. Each pixel is isolated by etching through all of the functional device layers (i.e., top contact layer, barrier layer, and photon absorbing layer), down to a bottom common contact layer disposed on the substrate and extending across all of the pixels, after which an ex-situ passivation layer is formed over the exposed sidewalls by a native oxide or by vapor deposition of materials such as CdTe or ZnS. It should be noted that an effective ex-situ passivation treatment is difficult to achieve in practice, without non-uniformities or without surface contamination due to the prior etching step, and the passivation materials used are only appropriate to the HgCdTe material family. In addition, for the device in this patent publication, there is a large barrier to minority carriers at the interface between the photon absorbing layer and the barrier layer and said minority carriers can only pass out of the photon absorbing layer by thermionic emission over said barrier.

The inventors of the present invention have understood that a major deficiency of such an mBn device as disclosed in U.S. Pat. No. 4,679,063, and possibly also a similar device with reverse doping polarity (mBp), stems from that the barrier layer and the photon absorbing layer have respectively opposite doping polarities (in the mBn the barrier is p-type and photon absorbing layer is n-type). Indeed, when the barrier layer is p-type and the photon absorbing layer is n-type (as well as the vice versa configuration), the photon absorbing layer is depleted near the barrier layer, because its donor (acceptor for vice versa configuration) levels should be ionized due to their energy alignment with respect to the acceptor (donor for vice versa configuration) levels in the barrier layer. A drawback of the depletion region in the photon absorbing layer is the resulting increase in G-R dark current (associated with noise) from this region.

It should further be understood that, if the equilibrium Fermi level between metal pads is pinned in the band gap region of the barrier layer between the pads, the depleted region of the barrier layer may provide electrical isolation between individual pixels/lateral-regions of the photodetector device, (e.g., between separated metal contact pads located on the barrier). If the equilibrium Fermi level is not pinned to this energy region of the band gap region of the barrier layer, an accumulation or inversion layer of free charges will form on the surface/boundary of the barrier layer thus providing a conduction path between the pixels/lateral-regions of the photodetector device, and destroy their isolation (i.e., causing current leakage between them/causing cross conduction between them). Moreover, all of these pixels could then be shorted to the common contact through a single defective pixel. In such cases a proper passivation of the surface/boundary of the barrier layer provides the correct pinning of the Fermi level.

To this end, certain embodiments of the present invention describe an integrated device structure and a process for fabricating the same, which allow metal pads to be placed/deposited on the barrier layer for use as contacts, while also ensuring that the equilibrium Fermi level between the metal pads is pinned at the correct energy (e.g., within the band gap of the barrier layer) to ensure good isolation between the metal pads. In certain embodiments of the present invention this is achieved by utilizing in-situ deposition of a passivation layer/structure (crystallized passivation structure) on top of the barrier layer and depositing/placing the metal pads/contacts at regions of the barrier layer at which the passivation structure is absent (etched/removed). The in-situ passivation layer/structure deposited on the barrier layer is configured to force pinning of an equilibrium Fermi level to be within the band gap of the semiconductor barrier layer and away from the conduction and valence bands thereof, thereby preventing/suppressing surface currents/leakage between the metal contacts.

Certain embodiments of the present invention also provide a novel photodetector device comprising a hetero junction formed by a semiconductor barrier layer formed/deposited on top of a semiconductor photon absorbing layer having similar doping polarity as the barrier layer, and in which the contact layer is replaced/formed by metal (e.g., metal contacts/pads), deposited directly on the barrier layer. The photodetector device of this embodiment of the present invention also does not require the growth of a semiconductor contact layer on top of the barrier layer and it is also not necessary to define individual devices (e.g., pixels) by etching a mesa structure through all of the contact layer. Another advantage of the photodetector device of this embodiment stems from the use of the same doping polarity for the photon absorbing layer and barrier layer. This eliminates/suppresses the depletion region from the photon absorbing layer and thereby suppresses/eliminates generation of a dark G-R current component from the photon absorbing layer resulting in a low, diffusion limited dark current noise from the photon absorbing layer. Indeed, the barrier layer is depleted (due to the hetero junction configuration of the photon absorbing layer and barrier layer. This is because the donor/acceptor energy level(s) of the barrier layer should be ionized due to their energy alignment with respect to the energy of the majority carriers in the photon absorbing layer). However, G-R processes are also suppressed in the barrier layer because of its large band gap, which dramatically reduces the probability of occurrence of such G-R processes. This actually suppresses the source for G-R currents from the barrier layer resulting in a low dark current noise from the barrier layer.

Thus according to one broad aspect of the present invention there is provided a photo-detector including:
(i) a photon absorbing layer including a semiconductor material having a first energy band gap;
(ii) a barrier layer including a second semiconductor material having a second energy band gap;
(iii) a passivation structure including at least one layer located on said barrier layer and having a third energy band gap; and
(iv) one or more metal contacts defining pixels of said photo-detector which are electrically coupled to said barrier layer at exposed regions of the barrier layer (e.g., at vias), at which said passivation structure is absent.

In this aspect of the invention the passivation structure includes a material having a high density of surface states thereby forcing pinning of an equilibrium Fermi level of the passivation structure to be within the third energy band gap and away from the conduction and valence bands of the barrier layer. This reduces surface current leakage and prevents electrical conduction between the one or more metal contacts defining the pixels of the photo-detector.

In some embodiments the semiconductor materials of the photon absorbing layer and the barrier layer are doped with a similar doping polarity. This results in the photon absorbing layer being un-depleted thereby suppressing G-R current from said photon absorbing layer and enabling a diffusion limited dark current in the photo-detector.

In some embodiments the second energy band gap of the barrier layer is larger than the first energy band gap of the photon absorbing layer, such that application of an operating bias voltage of a certain electric polarity to the metal contacts causes attraction of minority carriers from the un-depleted photon absorbing layer across depleted regions of the barrier layer to the metal contacts.

For example the energy band conducting minority carriers in the barrier layer may lie close to the energy band conducting the minority carriers in the photon absorbing layer such that the minority carriers can pass from the photon absorbing layer to the barrier.

In certain embodiments of the present invention the second energy band gap of the barrier layer is substantially larger than the first energy band gap of the photon absorbing layer such that G-R processes in the barrier layer are reduced and thereby dark G-R current from the barrier layer is suppressed. This enables a diffusion limited dark current in the photo-detector.

According to some embodiments of the present invention the photo-detector operates as a back illuminated photodetector. The photodetector may include a buffer layer (and/or a substrate layer) which is next to the photon absorbing layer and which is transparent to photons in the operating spectral range of the detector. The buffer layer may include semiconductor material and the photon absorbing layer is grown thereon.

In some embodiments the buffer layer is configured to reflect minority carriers back towards the photon absorbing layer, to prevent them from escaping from the photon absorbing layer. In some implementations a surface of a substrate, onto which the buffer layer is grown, is exposed by polishing the substrate to a thickness of less than 20 μm such that part of a thickness of less than 20 μm, or none of the substrate, remains. In some implementations an antireflection coating is applied at the back-side of the detector, on the surface that is exposed by the polishing.

In certain embodiments of the present invention the photon absorbing layer of the photo-detector includes at least one of the following: a bulk alloy and a superlattice structure. The photon absorbing layer may for example have a thickness of between 1-10 μm. The photon absorbing layer may for example include or be formed of group III-V semiconductor materials. The photon absorbing layer may for example comprise a superlattice structure (e.g., type II superlattice, T2SL) including a plurality of repeated superlattice units formed with different compositions of InGaAlAsSb materials.

In certain embodiments of the present invention the barrier layer of the photo-detector includes at least one of the following: a bulk alloy and a superlattice structure. The barrier layer may have a thickness of between 0.1-1 μm. The barrier layer may include group/type III-V semiconductor materials. For example the barrier layer may include/be-formed-as a superlattice structure including a plurality of repeated superlattice units formed with different compositions of InGaAlAsSb materials.

In some embodiments of the present invention the passivation structure includes at least one layer (i.e., passivation layer; e.g., crystallized), which is located on the barrier layer, and includes one of a bulk alloy and a superlattice structure. The passivation layer of the passivation structure, which is located on said barrier layer, may include group III-V semiconductor material(s) formed as a bulk alloy or as a superlattice structure which includes a plurality of repeated superlattice units formed with different compositions of III-V semiconductor materials. The III-V semiconductor material(s) of the passivation layer is/are associated with the third energy band gap of the passivation structure, and may be formed with different material compositions than the composition of the barrier layer which has the second energy band gap. In some cases the passivation layer of the passivation structure includes a p-type semiconductor material having a thickness of between 0.02-1 μm and doping in the range $10^{14}<p<10^{17}$ acceptors per cubic centimeter.

In some embodiments of the present invention the photon absorbing layer having the first energy band gap and the barrier layer having the second energy band gap include respectively different compositions of III-V semiconductor materials thereby forming a hetero junction between them.

In some embodiments of the present invention the metal contacts are coupled to the barrier layer to form Schottky junctions/contacts which collect minority carriers leaving the barrier layer.

In some embodiments the one layer (passivation layer) of the passivation structure is crystallized and has lattice matching (e.g., in the direction parallel to the substrate) with the barrier layer.

In some embodiments the passivation structure includes one thin layer of aluminum oxide made by in-situ deposition in the growth chamber of up to ten monolayers of aluminum on top of the barrier layer, followed, after removal from the growth chamber, by oxidation of the aluminum into aluminum oxide.

In some embodiments of the present invention the passivation structure includes a layer (passivation layer) that is formed with material similar to that of the barrier layer, thereby obviating a need for further passivation of exposed surfaces of the passivation structure and enabling to obviate the use of vias or to allow utilization of shallow vias with reduced depth.

In some embodiments of the present invention the passivation structure includes a cap layer including a thin bulk layer of InGaAlSbAs having a high density of surface states. For instance the cap layer has a thickness in the range 0.004-0.1 μm and may be made with a binary or alloy semiconductor material whose major component includes at least one of the following materials: InAs, GaSb and GaSbAs.

In some embodiments of the present invention the photodetector includes a reflective layer including a metal. The reflective layer is configured to reflect most of the radiation impinging thereon back for a second pass through the photon absorbing layer. In some cases one or more metal contacts/pads are also optically coupled to the exposed regions of the barrier layer such that they reflect most of the radiation impinging thereon back for a second pass through the photon absorbing layer.

In some embodiments of the present invention the photo-detector includes a stack of the following layers in the following order: the photon absorbing layer, the barrier layer, and one or more layer(s) of the passivation structure. The stack of layers are crystallized and are grown in-situ, by an epitaxial growth method such as molecular beam epitaxy.

In some embodiments of the present invention the photon absorbing layer, said barrier layer, and said first layer of the passivation structure comprise p-type semiconductor materials. For instance the photon absorbing layer and barrier layer are p-type semiconductor materials doped with acceptors in the range of $10^{14}<p<10^{17}$ per cubic centimeter.

In some embodiments the photo-detector is encapsulated with a thin insulating dielectric material and the metal contacts are coupled to the barrier at vias which are opened in the thin insulating dielectric material. In some cases the metal material of the metal contacts extends on top of a dielectric material over a large portion of the pixel area thereby enabling reflection of most of the radiation impinging on it back for a second pass through the photon absorbing layer.

In some embodiments of the present invention the photo-detector includes indium pillars electrically connecting the metal contacts of the pixels to read-out metal contacts of a silicon integrated read-out circuit. Open spaces surrounding the indium pillars may be filled with a glue under-fill.

In another broad aspect the present invention provides a novel silicon integrated circuit device attached to a III-V semiconductor structure which comprises at least one superlattice semiconductor layer having a certain energy band gap. The III-V semiconductor structure includes a semiconductor bulk or superlattice barrier layer with a larger energy band gap, and a passivation structure comprising at least one layer located on the barrier layer. According to this aspect of the invention the at least one layer of the passivation structure is crystallized and has a lattice match with the superlattice semiconductor layer and/or the barrier layer. Also, according to this aspect of the invention the passivation structure includes a material/layer having a high density of surface states, which forces pinning of an equilibrium Fermi level under said passivation structure to be within the band gap of the semiconductor barrier layer and away from the conduction and valence bands thereof.

In some embodiments the passivation structure has similar material to a semiconductor superlattice barrier layer thereby obviating a need for further passivation of exposed surfaces of the passivation structure.

In some embodiments at least one layer of the passivation structure includes III-V semiconductor materials. For example it may include a bulk InGaAlAsSb alloy or a superlattice structure comprising a plurality of repeated superlattice units formed with different compositions of InGaAlAsSb materials.

In some embodiments the at least one layer of the passivation structure is a crystallized layer grown in-situ and with lattice matching on top of the semiconductor barrier layer.

In some embodiments the passivation structure comprises a layer of aluminum oxide made by in-situ deposition of monolayers of aluminum on top of the semiconductor barrier layer, followed by oxidation of said monolayers of aluminum.

In some embodiments the passivation structure includes a cap layer having a high density of surface states.

In yet another broad aspect of the present invention there is provided a novel method for passivating a crystallized layer of a semiconductor device being one of a superlattice layer and a layer of group III-V semiconductor materials. The method includes depositing one or more layers of a passivation structure wherein said depositing includes growing at least one passivation layer in a crystallized form, in-situ in a growth chamber, on top of the crystallized layer of the semiconductor device, such that the passivation layer is lattice matched and has a fixed band alignment with said crystallized layer of the semiconductor device. The method provides a useful technique for passivating crystallized layers which are formed as superlattice layers and/or as a layer formed with group III-V semiconductor materials. According to the method of the invention depositing the one or more layers of a passivation structure includes deposition of at least one layer of material having a high density of surface states which forces surface pinning of an equilibrium Fermi level within a certain band gap of the crystallized layer of the semiconductor device.

In some embodiments of the present invention the method includes placing one or more metal contacts on exposed regions of the crystallized layer of the semiconductor device. The passivation structure prevents or suppresses conduction of electric current between said one or more metal contacts. In some embodiments placing the metal contacts includes etching the passivation structure to expose regions of the crystallized layer at which the metal contacts are to be placed and depositing metal material at the exposed regions.

In some embodiments the metal contacts placed on the exposed regions of the crystallized layer are configured as Schottky junctions/contacts which collect minority carriers leaving the crystallized layer.

In some embodiments the at least one passivation layer is grown with an energy band gap wider than an energy band gap of the crystallized layer of the semiconductor device which is to be passivated thereby.

According to yet another embodiment of the present invention there is provided a novel semiconductor device including a device layer comprising a crystallized layer being at least one of a superlattice layer, and a layer of group III-V semiconductor materials. The semiconductor device also includes a passivation structure comprising one or more layers wherein, according to this aspect of the invention:
(i) at least one of said one or more layers of the passivation structure is a passivation layer grown in-situ in a crystallized form on top of said device layer; and
(ii) at least one of said one or more layers of the passivation structure includes/serves as a cap layer material having a high density of surface states which forces surface pinning of an equilibrium Fermi level within a certain band gap of the device layer, away from its conduction and valence bands.

In some embodiments, in the semiconductor device the passivation layer is oxidized, thereby becoming an amorphous/non-crystalline layer serving also as the cap layer which has a high density of surface states.

In some embodiments the cap layer is an additional crystallized or amorphous/non-crystalline layer having a high density of surface states, which is deposited on top of the passivation layer of the passivation structure.

According to yet a further aspect of the present invention there is provided a photo-detector including:
(i) a photon absorbing layer including a first semiconductor material of a first doping polarity and having a first energy band gap;
(ii) a barrier layer including a second semiconductor material different than the first semiconductor material, and doped with the first doping polarity and having a second energy band gap, larger than the first energy band gap; and
(iii) one or more metal contacts deposited directly on the surface of the barrier layer. According to this aspect of the invention the first and second semiconductor materials are configured such that a heterojunction is formed between the photon absorbing layer and the barrier layer. Also the metal contacts on the second semiconductor material of the barrier layer form Schottky junctions defining pixels of the photo-detector device. The Schottky junctions collect minority carriers leaving the barrier layer.

BRIEF DESCRIPTION OF THE DRAWINGS

In order to better understand the subject matter that is disclosed herein and to exemplify how it may be carried out in practice, embodiments will now be described, by way of non-limiting example only, with reference to the accompanying drawings, in which:

FIGS. 1A-and 1B show exemplary diagrams of p-n photodiodes with ex-situ passivation.

FIGS. 2A-2F show schematically the configuration and operation of a conventional pBp semiconductor detector, wherein FIG. 2A shows the structure of semiconductor layers of the device; FIG. 2B shows a gate controlled pBp detector; FIGS. 2C and 2D show plots of the logarithm of the measured dark current vs. the device bias at a temperature of 78 K for different values of gate voltage of the gate controlled pBp detector of FIG. 2B, configured with a mesa area of 75>75 $\mu m^2$ and bonded by indium bumps to a silicon fan-out printed circuit respectively before and after a cured epoxy glue under-fill has been introduced into the space between the gate controlled pBp detector and the printed circuit, followed by removal of most of the substrate by polishing; and FIGS. 2E and 2F are energy band diagrams exemplifying the energy bands profiles along the cross-section line D-C' in between two mesas of the device of FIG. 2A without and with glue under-fill present, respectively.

FIGS. 3A-3C show schematically the configuration and operation of a photo-semiconductor device (termed herein βBp structure/detector) according to an embodiment of the present invention including an in-situ passivation structure; wherein FIG. 3A shows an exemplary diagram of functional layers of the βBp semiconductor layer structure according to an embodiment of the present invention; FIGS. 3B and 3C are diagrams exemplifying the conduction and valence band edge profiles at operating bias along cross-section line A-B that passes through the center of a metal contact pad attached to the barrier layer of the βBp semiconductor layer structure and having respectively small and large metal work-functions.

FIGS. 4A-4C show schematically the configuration and operation of a βBn photo-detector according to another embodiment of the present invention in which the semiconductor doping polarity is reversed as compared to the βBp photo-detector illustrated in FIGS. 3A-3D. Only the case of a large metal work function is shown (FIG. 4B).

FIG. 5C shows schematically the configuration and operation of a βBp detector structure shown in FIG. 5A being coupled/bonded to a silicon read-out integrated circuit (ROIC) with indium bumps.

FIGS. 7A to 7C shows schematically the configuration and energy band profiles of a βBp detector structure/photo-detector according to another embodiment of the present invention, in which the β-structure is made from a AlSbAs layer capped with a thin layer of GaSbAs.

FIGS. 8A-8C show schematically the configuration and energy band profiles of a βBp structure/photo-detector according to another embodiment of the present invention, in which a p-type barrier layer is grown on top of a p-type photon absorbing layer (both having the same doping polarity) and an in-situ passivation structure (structure) is formed by a few monolayers of aluminum oxide ($AlO_x$) on the surface of the barrier layer.

DETAILED DESCRIPTION OF EMBODIMENTS

FIGS. 1A and 1B described above relate to exemplary diagrams of the known p-n photo-diodes with ex-situ passivations.

Figure 2A:
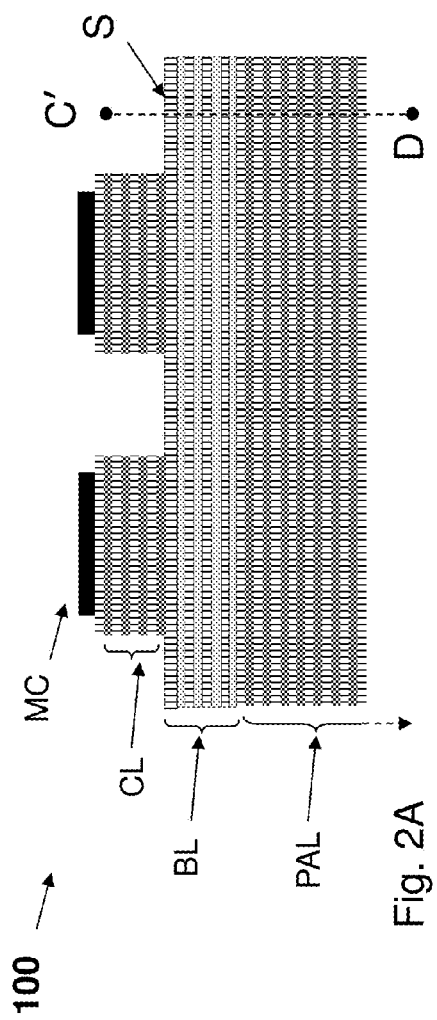

Reference is made to FIG. 2A which is a schematic illustration of the layer structure of a conventional XBn or XBp device 100 including an InAs/GaSb photon absorbing layer PAL, an InAs/AlSb barrier layer BL, and an InAs/GaSb contact layer CL. More specifically, in the present example, the device 100 is actually a pBp device, where all the layers CL, BL and PAL are p-type doped. Metal contacts MC are deposited on the contact layer CL at defined separate modules/pixels of the device associated with isolated mesa structures of the contact layer. The mesa structures are formed by etching the contact layer CL down to the barrier layer BL. This is necessary to suppress conduction between separate modules/pixels at different mesa structures.

Figure 2B:
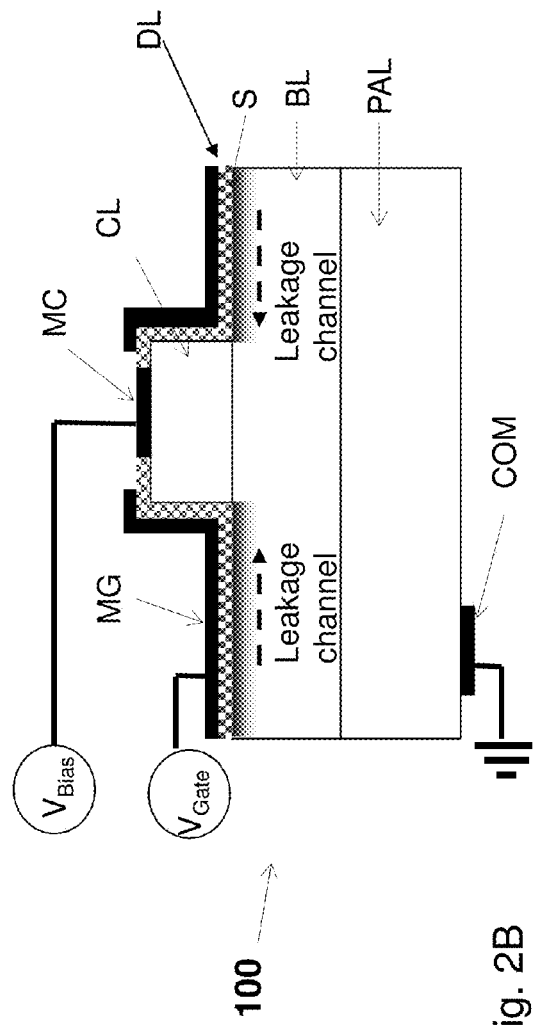

FIG. 2B is a schematic illustration of a gate controlled version of the pBp device 100 shown in FIG. 2A, having a gate electrode MG. Here the pBp device is configured with a mesa area of 75×75 $\mu m^2$ and is bonded by indium bumps to a silicon fan-out printed circuit. As described in the following, application of a gate voltage $V_{Gate}$ between the gate electrode MG and a common electrode COM was used to establish whether there is a need for passivation of the exposed surfaces of the barrier structure/layer.

In this particular example of FIG. 2B the device 100 is a pBp structure made by fabricating/growing a p-type photon absorbing layer PAL made from an InAs/GaSb Type II superlattice (T2SL) and then fabricating/growing thereupon a p-type barrier layer BL made from an InAs/AlSb T2SL. As will be appreciated by those versed in the art the phrase Type II refers to a staggered alignment of the energy band gaps of the two superlattice materials of semiconductor heterostructures. The average in-plane (parallel to the substrate) lattice parameter of a T2SL period is designed to be very close to that of the GaSb substrate on which the T2SL is grown so that high quality growth can be performed with very few dislocations or other disruptions to the ordered crystal structure. The p-type contact layer CL is also made/grown on top of the barrier layer BL from an InAs/GaSb T2SL and is then etched down to the barrier layer BL. A thin insulating dielectric layer DL such as SU8 is deposited on the exposed surfaces of the contact and barrier layers after etching the mesas. Metal contact(s) MC is/are deposited on top of the mesa(s) (on the top of the contact layer CL at the mesa(s)), at places at which via(s) is/are opened through the dielectric layer DL. The metal gate MG is also deposited onto the surface of the dielectric DL covering the top edges of the mesa, the mesa walls and the barrier layer surface. The metal gate MG is separated from the metal contact MC by a small gap. On the barrier surface the metal gate MG extends far from the mesa walls (typically several hundred microns when the mesa side dimension is 75 microns).

The device 100 has a square mesa side dimension of 75 μm and is attached using indium bumps to a silicon printed circuit (e.g., to a "Fan-out" circuit (FOC)), such that gate and bias voltages, $V_{Gate}$ and $V_{Bias}$, can be respectively applied separately to the metal gate MG, and the metal contact MC of the contact layer CL.

Figure 2C:
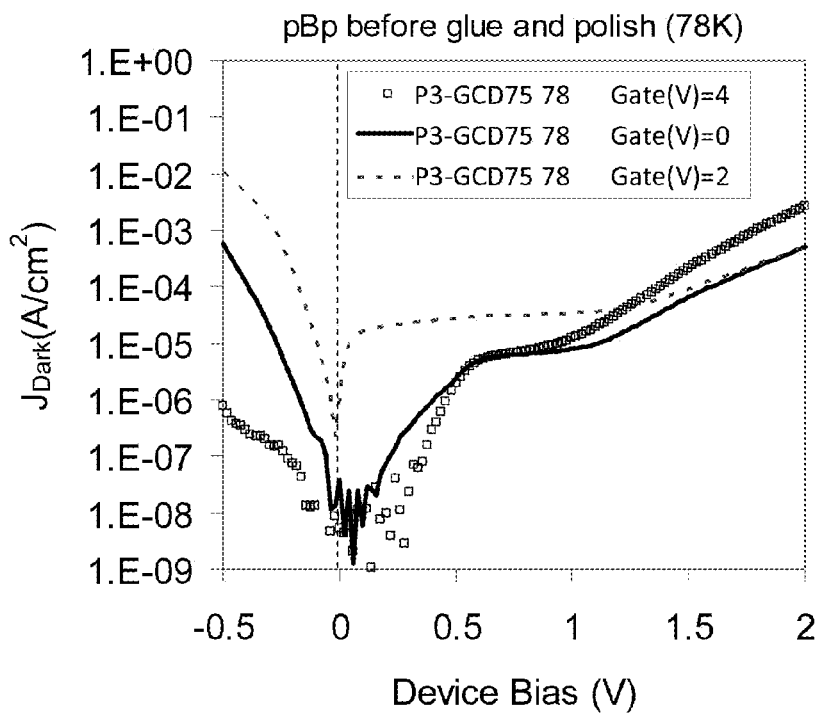
Figure 2D:
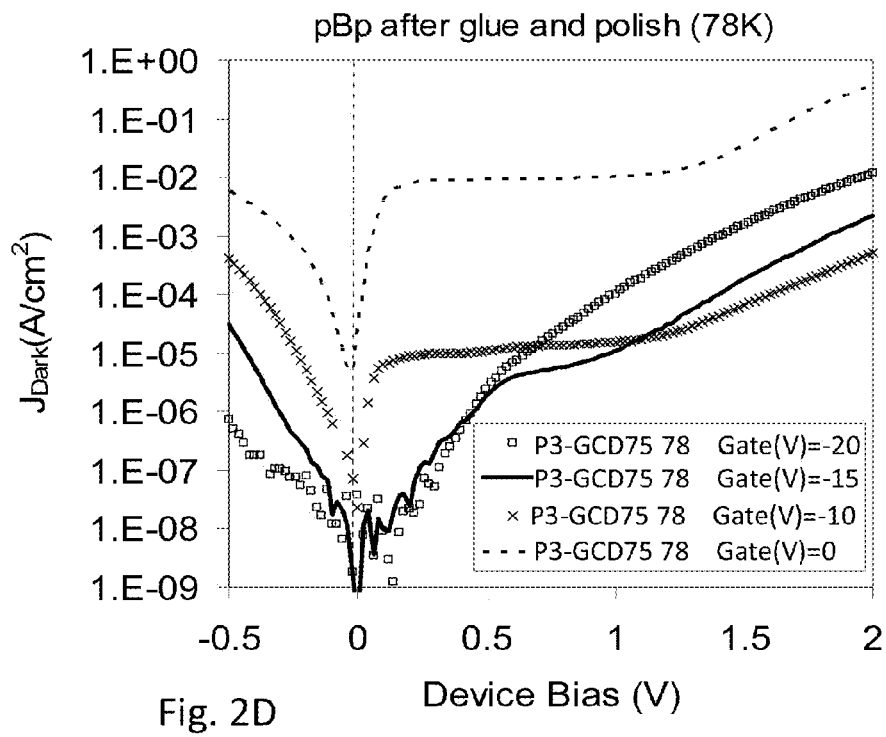

In an experiment conducted by the inventors, the dark current-voltage ($J_D$-V) characteristics of the device of FIG. 2B at the operating temperature of 78K were measured. FIGS. 2C and 2D show graphs of the dark current ($J_D$) through metal contacts MC of the device 100 shown in FIG. 2B at an operating temperature of 78K, as a function of bias voltage $V_{Bias}$ applied to the metal contacts MC, and for different values of gate voltages $V_{Gate}$ applied through the metal gate electrode MG.

FIG. 2C shows that operating the device 100 of FIG. 2B, without/before injection of glue under fill, and with zero gate bias results in an optimal dark current-voltage $J_D$-V characteristic having a flat, bias independent plateau, associated with diffusion limited dark current. The bias independent plateau extends in the operating bias voltage range from about $0.6V<V_{Bias}<1.1V$ when the gate voltage $V_{Gate}$ is 0V. This essentially corresponds to the operation of a standard device such as device 100 of FIG. 2A on which no gate is present. It is understood that it is generally desired that the dark current will not be affected by fluctuations of the bias (operating) voltage $V_{Bias}$ of the device 100, so that the fluctuations of the bias/operating voltage $V_{Bias}$ will not introduce noise. To this end the operating voltage $V_{Bias}$ of the device 100 should be at the plateau where the dark current is not affected by small changes in the operating voltage. Also (see for instance [08]), the beginning of the plateau region signifies the removal of an electrostatic barrier to the diffusion current flowing from the photon absorbing layer into the barrier layer (the electrostatic barrier which is caused by the space charge of ionized dopants in the barrier layer), and thus using a bias greater than the beginning of the plateau is needed for achieving the maximum quantum efficiency/responsivity of the detector.

It is also shown in FIG. 2C that when applying gate voltages of +2V or −4V the dark current plateau starts to degrade. It is no longer flat in the plateau region of bias and/or its absolute value starts to increase. These changes are caused by free surface electrons or free surface holes attracted to the surface of the barrier layer by the positive or negative gate biases, respectively.

FIG. 2D shows dark current-voltage ($J_D$-V) characteristics of the device 100 of FIG. 2B after injection and curing of a standard glue under-fill. Glue under-fill is conventionally used in integrated devices to fill the empty space around the indium bumps to make the device assembly sufficiently/more robust and/or to allow thinning (e.g., carried out by etching or polishing) of the base/buffer/substrate layer, on which the semiconductor layers (e.g., the PAL, BL and CL layers) of the device are grown, (e.g., thinning the substrate layer to a thickness of about 10 μm or less). It is noted that when designing the device 100 to function as an IR detector, its operating temperature may be a low/cryogenic temperature. In such cases, the glue under-fill provides a large stress/shear stress on the surface of the III-V detector structure in order to constrain its lateral dimension to match that of the silicon read-out-integrated-circuit (ROIC), which has a lower coefficient of thermal expansion. The more the buffer/substrate layer is removed/thinned, the smaller is the stress/shear stress between the detector structure/layers and the ROIC. Therefore use of glue under-fill and then thinning the substrate to a small final thickness is advantageous in many IR detectors.

However, as can be seen from FIG. 2D, after injection of glue under-fill and thinning of the substrate layer to a thickness of about 10 microns, the device dark current at zero gate voltage, $V_{Gate}$=0V, increases by more than three orders of magnitude. More specifically, comparing FIGS. 2C and 2D it can be seen that at zero gate voltage, without the glue under-fill (FIG. 2C) the plateau of the dark current is at dark current densities of the order of $10^{-5}$ A/cm$^2$, but with the glue under-fill (FIG. 2D) the plateau of the dark current is at dark current densities of the order of $10^{-2}$ A/cm$^2$. Indeed, (see FIG. 2D) if a gate bias is applied close to −15V, the dark current plateau at the operating bias (about 0.6V<$V_{Bias}$<1.1V) can be restored. However, use of such high gate voltages is undesirable in commercial devices for example because of the following:

1) there is usually not enough space in a commercial array detector for an extra indium bump for biasing the gate, unless the detector performance is compromised in order to free up the space; and 2) if one large gate is used to apply the bias, (e.g., with a single bump connection at the edge of the array area), in cases where there is at least one defective pixel which leaks (which is common) it will short circuit to the photon absorbing layer (which is connected to common COM) and prevent it from being biased.

Figure 2F:
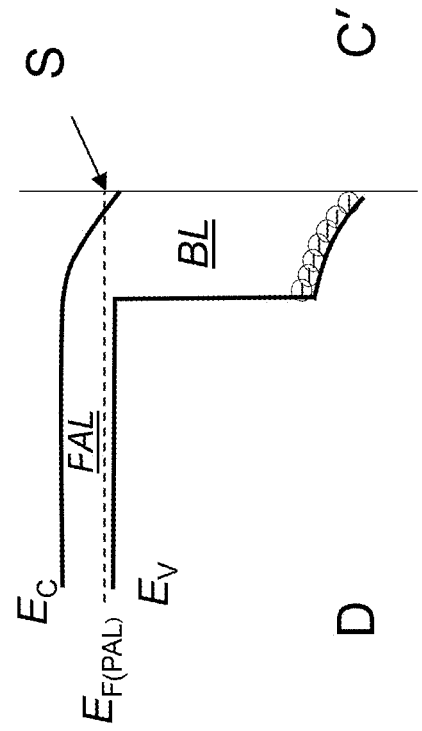
Figure 2E:
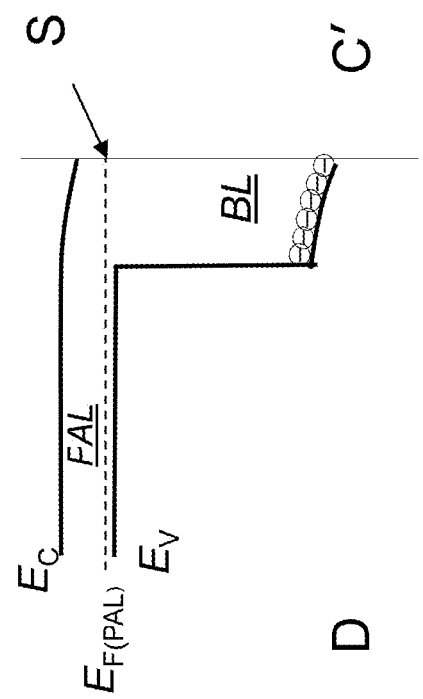

FIGS. 2E and 2F are energy band diagrams exemplifying the energy band profiles along cross-section line D-C' in between two mesas of the semiconductor layers of the device of FIG. 2A, respectively without and with glue under-fill present. The ionized acceptors in the barrier layer BL are shown in the figure as circles with a "minus" sign inside. In FIG. 2E, corresponding to a case of no glue under-fill, the surface S of the barrier layer BL is at equilibrium with the bulk photon absorbing layer and the equilibrium Fermi level passes from $E_{F(PAL)}$ to the surface S where it is pinned at an energy slightly below the conduction band $E_C$. In FIG. 2F, which corresponds to the case where a standard glue under-fill is present, the conduction band $E_C$ at the surface S bends below the equilibrium Fermi level which passes from $E_{F(PAL)}$ and this results in surface current leaks.

The experimental results described with reference to FIGS. 2B to 2D teach that the stress/shear stress due to the presence of the under-fill creates a large positive surface potential on the barrier layer. The positive potential attracts an inversion layer of free electrons and this creates a short circuit to other devices and also to the common contact (through defective pixels which leak to the photon absorbing layer which is connected to COM). This is because the profile of the conduction and valence band edges in a typical pBp device (without gate) when under-fill is present, is actually as shown in FIG. 2F. Along the cross-section line DC' that passes between etched mesa contacts, the equilibrium Fermi level at the barrier surface S crosses into the conduction band of the barrier layer BL, creating an electron inversion layer. On the other hand, in the absence of under-fill there is no inversion layer, and the typical profile of the conduction and valence band edges must be as depicted in FIG. 2E. In this case the equilibrium Fermi level at the surface S is close to but below the conduction band of the barrier layer, BL. To this end, in cases where standard under-fill is to be used, a passivation treatment is essential in order to suppress surface current leaks (e.g., eliminate the surface inversion layer of free electrons) between pixels/modules of the device/detector 100.

In the following, various embodiments of semiconductor structures/devices are described with reference to FIGS. 3A-9C. In some of these embodiments/figures, only some part of the functional device-layer structure of the semiconductor device is illustrated. For example some figures show only certain parts of the functional semiconductor layers of the device. For instance some of the figures/embodiments possibly do not show the conventionally used substrate and/or buffer layers on which the functional device layers are grown, and/or do not show other elements which may be added/coupled to such a device, such as a readout circuit, which may be bonded to the semiconductor device/structure via bumps, and/or do not show coatings, such as anti-reflection coatings and/or dielectric layers, which may be deposited on the semiconductor layer structure. Nevertheless, it should be understood that such conventional elements/layers may be included in, or be a part of, the semiconductor layer structures/devices illustrated in any of the embodiments of the invention described below even if they are not specifically depicted/described. For instance, in all of the embodiments below, semiconductor device layers such as the photon absorbing layer PAL, and/or barrier layer BL and/or layer(s) of the in-situ passivation structure β (which is indicated in the figures by ISPS) are grown on a substrate layer and/or on a buffer layer grown on the substrate in order to have improved crystal structure (less crystal defects). The embodiments below may for example all be grown on GaSb substrates and/or on a GaSb buffer or a buffer with a similar in-plane lattice parameter grown on a GaAs, Si, InSb, CdTe, InAs, or InP substrate. The growth method may be molecular beam epitaxy (MBE) or possibly another epitaxial method (e.g., Metal Organic Vapor Phase Epitaxy).

Many embodiments of the invention described below concern a stack of semiconductor layers configured for operation as photo-detector arrays (herein after also just referred to as photodetector) and specifically such that are operative in the Infra-Red regime. It should be understood that common to the embodiments described below, even if not particularly specified in the following, is that all include the combination of the following features of the invention:

(1) A photon absorbing layer PAL and a barrier layer BL which are formed of semiconductor material of the same doping polarity so as not to form a p-n junction between them, such that the photon absorbing layer PAL is not depleted;

(2) A photon absorbing layer PAL and a barrier layer BL are formed with different materials/compositions which are selected such the barrier layer BL has a higher band gap and such that a hetero-junction is formed between the photon absorbing layer PAL and the barrier layer BL causing the barrier layer to be depleted;

(3) Metal contacts/pads of the device are deposited/placed/coupled directly to the surface of the barrier layer BL such that a Schottky junction/contact is formed between them. This junction/contact is able to inject minority carriers into the BL/PAL (e.g., electrons when BL/PAL are p-type and holes when BL/PAL are n-type) when a forward bias is applied. In the detector configuration according to the embodiments of the present invention, the Schottky junction of the contact is connected/associated with a reverse bias such that the junction/contact collects minority carriers leaving the barrier layer BL and a low dark current condition exists;

(4) An in-situ passivation structure "β" (also denoted below as ISPS).

In some embodiments at least one crystallized passivation layer PL is included, having a wide bandgap, which is grown, in situ, on another layer such as the barrier layer BL of the device. In some embodiments the barrier layer BL on which is grown the passivation layer PL in-situ thereon is formed as T2SL layers having a predetermined wide bandgap. The passivation layer has the same doping polarity as the barrier layer BL so that no p-n junction is formed therebetween.

In some embodiments the passivation layer PL which is grown in-situ thereon is formed by crystal growth of Al (e.g., of some few aluminum mono-layers) and is then oxidized to aluminum oxide ($AlO_x$) after growth is completed.

In some embodiments the in-situ passivation structure "β" includes at least one layer (cap layer, CAPL) grown on top of the passivation layer PL configured to pin the equilibrium Fermi level at the surface to be within the energy band gap of a crystallized layer below it (and well within the band gap of the barrier layer), thereby preventing surface currents. The cap layer is crystallized so that it forms a clean/uncontaminated junction with the underlying layer and is chosen because of its well defined band structure and surface properties.

In some embodiments the equilibrium Fermi level is pinned at the surface by the passivation layer PL itself (e.g., as in the case of an $AlO_x$ layer).

Figure 9A:
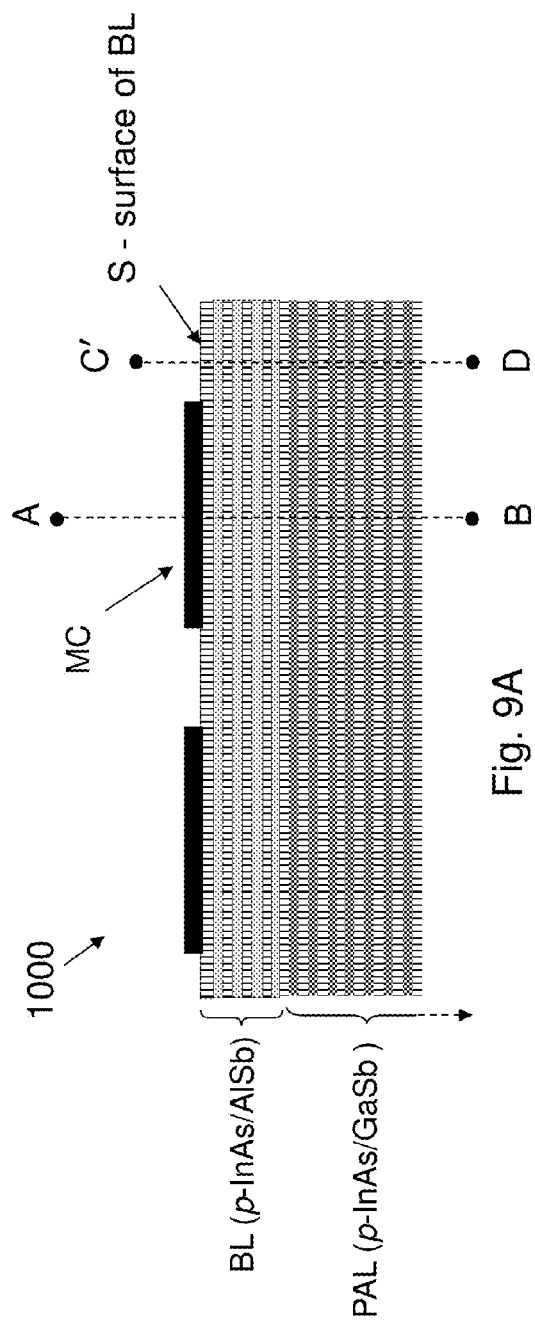
FIGS. 9A to 9C show schematically the configuration and energy band profiles of a structure/photo-detector according to another embodiment of the present invention.
Figure 9C:
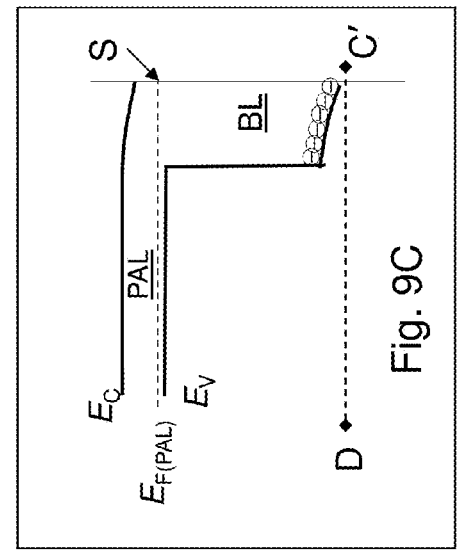
Figure 9B:
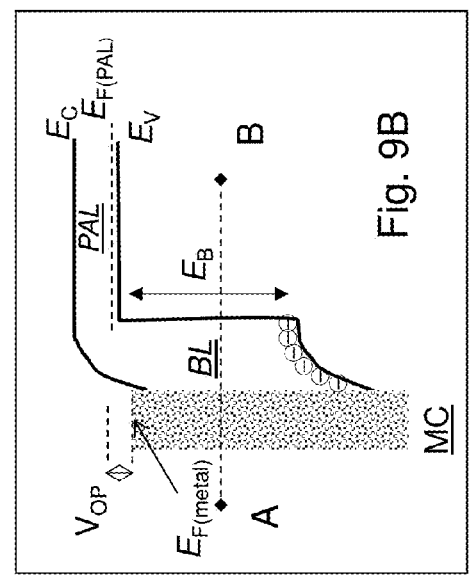

In some embodiments, (e.g., when use of glue under-fill is not required), the barrier layer BL may be configured to serve as its own in-situ passivation (see FIGS. 9A-9C).

It should be noted that in the following description, devices configured according to the present invention exhibiting the combination of features (1) to (4) above are referred to as "βBp" or "βBn" structures where "β" stands for the passivation structure including the passivation layer PL and possibly also the cap layer CAPL, "B" stands for the barrier layer BL and the "p" or "n" respectively denote the type of doping of the photon absorbing layer PAL and also of the passivation and barrier layers, PL and BL. Devices exhibiting the combination of features (1) to (4), and when the barrier layer BL is configured to serve as its own in-situ passivation, may be viewed as a modification of "βBp" or "βBn" structures in which the passivation layer PL is of the same material composition as that of the barrier layer BL.

Some of the embodiments/figures below describe/depict only the functional photodetection semiconductor layers (also indicated as device layers; e.g., including the βBp or βBn structure). Other embodiments show combinations of a specific βBp or βBn structure according to the invention with one or more of the following features/elements:

(1) a readout circuit ROIC appropriately bonded to the photodetection structure (e.g., using indium bumps, with or without glue under-fill);

(2) when the device is configured as a back illuminated photodetector and when glue under-fill is used between the ROIC and the photodetection/device layers, the substrate and/or buffer layers can be thinned (polished/etched) to improve their transparency and reduce stresses when cooled; possibly antireflective coating may be added at the back surface of the substrate and/or buffer layers;

(3) reflective layer(s) (e.g., of metal material) may be placed above the crystalized semiconductor layer structure/stack such as to reflect photons impinging thereon for a second pass through the photon absorbing layers.

It should be understood and as will be readily appreciated by those versed in the art, features/elements (1) to (3) above, which are described below in combination with specific βBp and/or βBn semiconductor structures/devices can be incorporated also in any other embodiments of the βBp and/or βBn semiconductor structures/devices of the present invention (e.g., these features can be incorporated also in the embodiments below for which these features are not specifically illustrated/described).

FIG. 3A is a schematic illustration of the βBp layer structure of a βBp semiconductor device 500 according to some embodiments of the present invention, which is configured to provide a solution to the problem associated with the current leakage through the surface S of the barrier layer BL (constituting at least part of the device layer structure, i.e., functional part of the device).

According to an embodiment of the present invention, the βBp semiconductor device 500 includes: at least one type III-V semiconductor superlattice layer, being a device layer DEVL having a certain energy band gap, a barrier layer BL comprising a semiconductor bulk material or superlattice having an energy band gap larger than the certain energy band gap of the device layer DEVL, an in-situ passivation material/layer/structure ISPS, which is grown in-situ above (e.g., directly on top of) the barrier layer BL, and metal contacts MC (pads) placed directly on the barrier layer BL at places where the passivation structure is absent (etched) (this is instead of the conventional contact layer which is usually grown on the barrier layer BL). It should be noted that here the device layer DEVL, the barrier layer BL and also the passivation structure have the same doping polarity (p-type in this case).

In the following examples of FIG. 3A to 9C, semiconductor devices are shown, which can be operated as photodetectors. The device layer DEVL is configured and operable as a photon absorbing layer PAL, and, accordingly, and without loss of generality, in the following the device layer DEVL will be referred to also as the photon absorbing layer PAL. It should be understood, however, that the principles of the invention may be applied to various other integrated structures, particularly when a need arises for in-situ passivation of one or more layers of the device (e.g., to suppress surface currents), and, even more particularly, when passivating a superlattice layer/structure such as a superlattice of type III-V semiconductor materials.

More specifically the method of the invention for passivating a semiconductor device with a superlattice layer and/or with layers of type III-V semiconductor materials may be used to fabricate various semiconductor devices not necessarily in the field of photo-sensing. In general, the method of the present invention for passivation of such semiconductor layers includes depositing one or more layers of a passivation structure on top of a crystallized layer of the semiconductor device which is to be passivated, being one of a super-lattice layer of the device and/or layer of the device formed with semiconductor materials of group III-V. According to the method of the invention the deposition includes: (i) growing at least one passivation layer of the passivation structure β, in a crystallized form, in-situ in a growth chamber, such that it is configured as a crystallized passivation layer, located on top of a crystallized layer (superlattice and/or type III-V layer) of the device which is to be passivated; (ii) the crystallized passivation layer is grown such that it has lattice matching with the crystallized superlattice and/or type III-V layer of the device; and (iii) the deposition includes depositing at least one layer of material having a high density of surface states, which forces pinning of an equilibrium Fermi level to be within a certain band gap of the crystallized layer (superlattice and/or type III-V layer) of the device and away from its conduction and valence bands. The at least one layer may be an additional layer located on top of the crystallized passivation layer, or in some cases the passivation layer itself may have the high density of surface states required to force the pinning of the equilibrium Fermi level. It should be noted that in some embodiments of the present invention, the at least one passivation layer is grown with an energy band gap wider than an energy band gap of the crystallized layer of the semiconductor device which is to be passivated thereby. The method may include placing one or more metal contacts on the exposed regions of said crystallized layer of the semiconductor device, and the passivation structure prevents or suppresses conduction of electric current between said metal contacts. The metal contacts may serve as "reverse-biased" Schottky junctions/contacts which collect minority carriers flowing out of the semiconductor device. Other features and advantages of the method of the invention are described in the following with references to semiconductor devices of the invention implementing the passivation method.

Figure 3D:
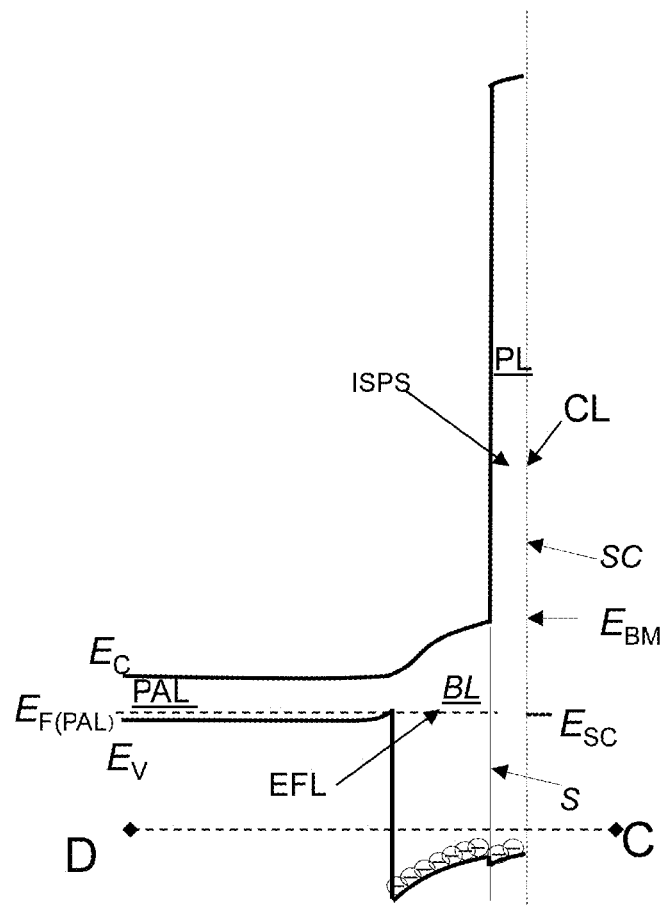
FIG. 3D is a diagram exemplifying the conduction and valence band profiles along the cross-section line D-C that passes in between metal contact pads through the passivation structure β of the βBP semiconductor structure.

Turning back to FIG. 3A, the photon absorbing layer PAL of the photo-detector device 500 is configured and operable in a desired operating spectral band of the device (e.g., a spectral band in the infra-red regime) and it includes a semiconductor material having a first energy band gap suitable for absorbing photons in that spectral band. The barrier layer BL includes a second semiconductor material having a second energy band gap, and the passivation structure ISPS includes at least one layer PL located on the barrier layer BL and having a third energy band gap. It should be noted that passivation structure ISPS includes a material having a high density of surface states which forces pinning of the equilibrium Fermi level (EFL) at the surface of the passivation structure ISPS so that the EFL is within the third energy band gap of the passivation structure ISPS and away from the conduction and valence bands of the barrier layer BL. This reduces surface leakage and prevents/suppresses electrical conduction along the surface of the barrier layer. FIG. 3D, which is described in more detail below, is a schematic illustration of the energy bands of the photon absorbing layer PAL, barrier layer BL, and the passivation structure ISPS of the photo-detector device 500 of the invention taken along cross-section line D-C of FIG. 3A.

In the example of FIG. 3A one or more metal contacts MC defining pixels of the photo-detector 500 are electrically coupled to the barrier layer BL at exposed regions of the barrier layer BL, at which the passivation structure ISPS is absent. The pixels are defined for example by etching vias VIA through the passivation structure ISPS down to the p-type barrier layer BL and depositing a metal pad having a small work function or a large work function onto the exposed barrier surface. Between these metal pads there is the un-etched p-type in situ passivation layer PL which was deposited/grown in situ on, and in contact with, the upper surface of the barrier layer BL.

The in situ passivation layer PL is configured with a wide energy band gap so as to prevent/suppress conduction between the metal pads. More specifically, the passivation layer PL is configured such that the equilibrium Fermi level (EFL) passes through its band gap, preferably such that its valence and conduction bands are each at least 10 $k_B T_{op}$ away from the EFL so that they do not contain enough carriers to conduct between the metal pads.

Also, in this example an additional cap layer CAPL is included/deposited/grown on the passivation layer PL. The cap layer CAPL includes material(s) providing a high density of surface states which can pin the equilibrium Fermi level at the top surface of the complete structure ISPS at a specific energy within the third energy band gap of the passivation structure thus preventing/reducing surface conduction between pixels. FIG. 3A also shows a standard common metal contact COM electrically connected to the photon absorbing layer and serving as a common contact for all the pixels.

Figure 6A:
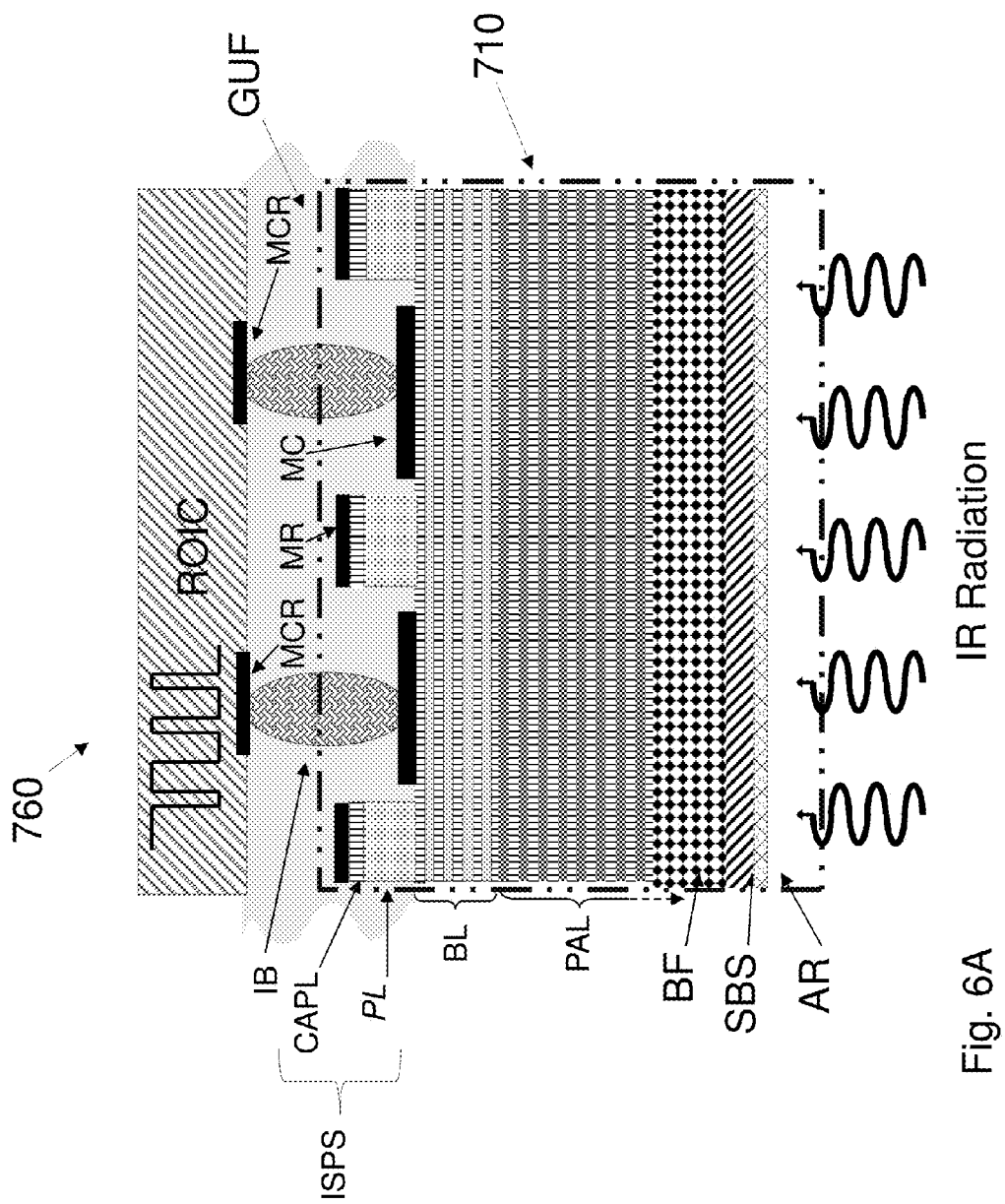
FIGS. 6A to 6C show schematically embodiments of the βBp detector illustrated in FIGS. 5A and 5C including a reflective layer configured to reflect radiation impinging thereon back for a second pass through the photon absorbing layer of the βBp detector.

It is noted here in general and for all embodiments, that in some embodiments of the present invention the pixels are further defined by narrow trenches (not specifically shown in the figure) formed in the passivation structure ISPS (and possibly extending to the photon absorbing layer PAL and/or to any additional layers that may be deposited on top of the passivation structure, such as a metal reflecting layer MR shown in FIG. 6A) in between neighboring metal contacts MC of the pixels (e.g., equidistant therefrom). The narrow trenches may be formed by etching and may have nearly vertical sidewalls extending through most or all of the photon absorbing layer PAL. This reduces the proportion of minority carriers that diffuse into a different pixel from the one in which they are excited, and may be used particularly when the pitch (separation between pixels) is small, to reduce crosstalk between neighboring pixels and thereby improve the image quality of the array detector.

With reference to FIG. 3D, which shows an exemplary energy band profile along the line D-C of the device 500 illustrated in FIG. 3A, the first, second and third energy band gaps of the photon absorbing layer PAL, the barrier layer BL, and the passivation structure ISPS are illustrated. The energy profiles $E_V$ and $E_C$ of the valence and conduction bands through the stack of layers are also illustrated. The ionized acceptors in the barrier layer and ISPL layer are shown as circles with a "minus" sign inside. $E_{BM}$ designates the conduction band energy at the surface S of the barrier layer BL which is shown bending up due to the band bending caused by the pinning of the equilibrium Fermi level at the surface SC of the passivation structure ISPS (more generally it designates the energy the minority carriers should have in order for them to conduct current through the surface S of the BL).

As shown in this figure, the equilibrium Fermi level passes far from the band edges of the BL and PL, preventing surface conduction, and the pinning reduces the sensitivity of the device to the effect of a glue under-fill. The conduction band $E_C$ in the wide band gap PL layer is shown to lie above that of the barrier layer BL and its valence $E_V$ is shown to lie below that of the barrier layer BL, but their exact positions are arbitrary (depending on the materials chosen). They should, however, each remain at least $10k_BT_{op}$ from the equilibrium Fermi level EFL along the line DC, in order to prevent surface conduction.

The cap layer CAPL of the passivation structure ISPS is configured (e.g., by proper selection of material composition and doping concentration) to have a very high density of states near energy $E_{SC}$ that pins the equilibrium Fermi level EFL at its surface SC at the energy $E_{SC}$.

The cap layer CAPL is configured such that the high density of states near energy level $E_{SC}$ of the CAPL reduces surface leakage and prevents/suppresses electrical conduction through the surface S of the BL between the one or more metal contacts MC defining the photo-detector pixels, and accordingly there is proper electrical isolation between the pixels. In the bulk, the equilibrium Fermi level EFL passes through the Fermi level of the photon absorbing layer, $E_{F(PAL)}$, so $E_{F(PAL)}=E_{SC}$. Thus configuring the cap layer CAPL such that the high density of states energy level $E_{SC}$ is below the conduction band energy at the surface S of the barrier layer BL (in the case of p-type doping) $E_{SC}<E_{BM}-mk_BT_{OP}$ (with m>10) results in the barrier layer BL and the passivation layer PL being depleted with their band edges far from the equilibrium Fermi level. This prevents/substantially suppresses the surface conduction.

FIGS. 3B and 3C show exemplary band profiles at the operating bias along the line A-B of the device 500, which passes through the metal contact MC, wherein FIG. 3B relates to the case where the metal material(s) of the metal contact MC has a relatively small work function (e.g., below about 4.9 eV, which is roughly the energy depth of the T2SL conduction band) and FIG. 3C relates to the case where the metal contact MC has a relatively large work function (e.g., above about 4.9 eV). The Fermi levels of the metals $E_{F(metal)}$ are depicted in the figures. It can be seen that a metal with a large work function results in a larger operating bias, $V_{OP}$, than a metal with a small work function. Note that in these figures the bands in the p-type photon absorbing layer PAL are flat. The photon absorbing layer PAL and the barrier layer BL are doped with the same doping polarity (p-type in this case), and thus the photon absorbing layer PAL is not depleted. Therefore, the detector dark current from the photon absorbing layer PAL is substantially (mainly/only) due to diffusion current of electrons from this layer, and the G-R currents are suppressed because the depletion region is confined within the wider band gap p-type barrier layer BL. The band gap (second energy band gap) of the barrier layer BL is large (substantially wider than the band gap (first energy band gap) of the photon absorbing layer PAL and therefore G-R processes which generate charge carriers are suppressed in the barrier layer BL and accordingly G-R currents from this layer are suppressed too. This configuration of the device 500 in which G-R currents from the photon-absorbing layer PAL are suppressed, and G-R processes in the barrier layer are suppressed, provides a photo-detector having a substantially diffusion limited dark current.

It is noted that the energy band conducting minority carriers (in the device exemplified in these figures, whose layers are p-type, the energy band conducting minority carriers is the conduction band) in the barrier layer BL lies close to an energy band conducting the minority carriers (here conduction band) in the photon absorbing layer PAL such that the minority carriers can pass freely from the photon absorbing layer PAL to the barrier layer BL. Since the second energy band gap (of the barrier layer BL) is larger than the first energy band gap (of the photon absorbing layer PAL) application of an operating bias voltage of a certain electric polarity to the metal contacts will cause/result in attraction of minority carriers from the un-depleted photon absorbing layer PAL across depleted regions of the barrier layer to the metal contacts, thus operating the photodetection function of the device 500.

Turning back to FIG. 3A, as indicated above the photo-detector device 500 exemplified in this figure includes a stack of the following layers in the following order: the photon absorbing layer PAL, the barrier layer BL and the passivation structure ISPS (e.g., the passivation/cap layers PL/CAPL). The photon absorbing layer PAL is configured for the absorption of photons in the desired spectral band and the creation in response of minority charge carriers (electrons in this case) in the energy band conducting the minority carriers (here the conduction band), such that they can flow and conduct current in response to the absorbed photons. The barrier layer BL has a large band gap which therefore suppresses G-R currents and blocks majority carriers in the photon absorbing layer PAL from passing to the metal contacts MC either by thermionic emission over the BL (because it is tall) or by tunneling through the BL (because it is tall and has a suitable thickness, typically a few tenths of a micron). The passivation structure ISPS suppresses/diminishes leakage of surface currents between the pixels.

An advantage eminent in some embodiments of the present invention relates to the fact that this stack of layers can-be/is grown in-situ and possibly at once (within the growth chamber and without taking the device out of the growth chamber). For example this stack of layers can be grown by utilizing conventional epitaxial growth techniques, such as molecular beam epitaxy.

To this end, the photon absorbing layer PAL (e.g., in general the device layer DEVL), and/or the barrier layer BL, and/or layers (e.g., PL and/or CAPL) of the passivation structure may be grown in the form of a bulk alloy in crystallized form and/or in the form of a superlattice/digital alloy structure. A digital alloy is used herein to refer to a superlattice of very thin layers, such as AlAs/AlSb, that is often easier to grow than a bulk alloy, such as AlSbAs).

As indicated above, conventional passivation layers are typically amorphous/non-crystalline layers of passivation materials such as SU8, $SiO_x$ or $SiN_x$ which are prepared ex-situ (e.g., by spinning (SU8) or by growth in a plasma gas phase growth reactor, after surface etching/patterning of the device layers). An advantage of certain embodiments of the present invention stems from the ability to use in-situ crystallized, and possibly a superlattice structure, in the passivation layer. This is advantageous because, as compared to amorphous materials, an in-situ crystalline material is associated with the following:

1) It has a higher quality and uniformity, with fewer surface states at the interface with the exposed BL onto which it is deposited 2) It has fewer bulk states in its band gap region due to unsatisfied bonds which can hold unwanted charges 3) It is deposited on a surface which is nearly atomically perfect/ideal/clean compared with any form of ex-situ passivation where the surface onto which it is deposited may contain unwanted contamination due to atoms remaining from a prior fabrication/etching treatment.

In the present example the photon absorbing PAL, and the barrier BL, are grown in the form of superlattice structures. The PL can be grown as a bulk alloy or as a digital alloy/superlattice structure. Also, in the present example, these layers comprise type III-V semiconductor material(s). More specifically in the present example the photon absorbing layer PAL, and the barrier BL, and optionally the passivation PL layers comprise superlattice structures comprising a plurality of repeated superlattice units formed with different compositions of III-V semiconductor material(s) (in this example the layers are formed with different compositions of InGaAlAsSb bulk materials).

It is noted that using similar materials for the passivation layer PL and the barrier layer BL may in specific cases obviate a need for further passivation of exposed surfaces of the passivation structure ISPS and obviate use of vias or allow use of shallow vias having reduced depth (e.g., vias' depths in the range: 0≤depth≤PL thickness).

In the present example, the photon absorbing layer PAL has a thickness of between 1-10 μm, the barrier layer BL has a thickness of between 0.1-1 μm, and the passivation structure ISPS has a thickness of between 0.02-1 μm. The passivation layer PL of the passivation structure ISPS is crystallized (not amorphous) and has lattice matching with the barrier layer BL, thereby providing improved electric properties. In this example the passivation structure ISPS also includes the cap layer CAPL which includes a thin bulk layer of type III-V semiconductor material (e.g., InGaAlSbAs in this case) having said high density of surface states. The cap layer CAPL has a thickness in the range 0.004-0.1 μm and is a binary or alloy semiconductor material whose major component includes at least one of the following materials: InAs, GaSb and GaSbAs.

As indicated above, the stack of layers of the device 500 of FIG. 3A up to (but not necessarily including) the cap layer CAPL comprises p-type semiconductor materials. Here, the passivation layer PL of the passivation structure ISPS comprises a p-type semiconductor material doped with $10^{14}<p<10^{17}$ acceptors per cubic centimeter. It should be noted however, that the device of the invention can be designed also using n-type semiconductor materials in the stack of layers. This is described in the following with reference to device 600 of FIGS. 4A-4C.

FIG. 4A is a schematic illustration of a βBn layer structure of a βBn device 600 according to some embodiments of the present invention. The device 600 is similar in configuration to device 500 of FIG. 3A except that the doping polarity of the layer structure of the device 600, and its band structure, are both inverted as compared to those of βBp device 500 of FIG. 3A. To this end the device 600 operates with the same principles as the device 500 described above and suppresses surface current leakage through the surface S of the barrier layer BL.

More specifically in this example the photon absorbing layer PAL and the barrier layer BL are doped n-type. The passivation layer PL of the passivation structure ISPS which is grown in-situ on top of the barrier layer, is also doped n-type, and has a wide energy band gap.

Also in this example the semiconductor device 600 is configured and operable as a photodetector, with the device layer DEVL being a photon absorbing layer PAL having a first energy band gap suited for the operable spectral band of the device. The barrier layer BL includes a second semiconductor material having a second energy band gap, and the passivation structure ISPS includes at least one layer PL located on the barrier layer BL and having a larger third energy band gap, and includes a cap layer material CAPL having a high density of surface states which pins an equilibrium Fermi level (EFL) at the surface SC of the cap layer CAPL. The EFL passes through the third energy band gap of the passivation structure ISPS and away from the conduction and valence bands of the barrier layer BL. The energy bands of the layers DEVL/PAL, BL and ISPS along cross-section line D-C of the device 600 are illustrated in more detail and in self-explanatory manner in FIG. 4C.

In the device 600, the metal contacts MC, which are coupled to the exposed regions of the barrier layer BL to define the pixels of the photo-detector 600, are made of a material having a large work function. It is noted that in this case, where the layers are n-type, use of a metal having a small work function will result in a larger operating bias (due to the doping polarity reversal compared with FIG. 3A). As described above with reference to FIG. 3A, also here the in situ passivation layer PL that remains after etching, between the metal pads, is configured with a wide energy band gap so as to prevent/suppress conduction between the metal pads. Also in this example the passivation structure ISPS includes a cap layer CAPL including material(s) having a high density of surface states, which pin the Fermi level at the top surface of the complete structure ISPS at a specific energy within the energy band gap (third energy band gap) of the passivation structure, to thereby prevent/reduce surface conduction between pixels.

FIGS. 4B and 4C show the energy band profiles of the first, second and third energy band gaps of the photon absorbing layer PAL, the barrier layer BL and the passivation structure ISPS along the lines A-B and D-C of the device 600 respectively. These figures are illustrated in a self-explanatory manner using notations similar to those indicated above with reference to FIGS. 3B-3D. The ionized donors in the barrier layer BL and in-situ passivation layer ISPL layer are shown as circles with a "plus" sign inside.

$E_{BM}$ in FIG. 4C designates the valence band energy at the surface S of the barrier layer BL which is shown bending down due to the band bending caused by the pinning of the equilibrium Fermi level at the surface SC of the passivation structure ISPS (more generally, as indicated above with reference to FIG. 3D, $E_{BM}$ is the energy the minority carriers should have in order for them to conduct current through the surface S of the BL).

It is noted that in cases where the layers are doped n-type, as in FIGS. 4A-4C, the energy the minority carriers (holes in this case) should have in order for them to conduct current is at the valence band energy of the barrier layer BL, however in cases where the layers are doped p-type, as in FIGS. 3A-3D, then the energy the minority carriers (electrons in that case) should have in order for them to conduct current is at the conduction band of the barrier layer. In the case of FIG. 4A, the cap layer is configured (e.g., with proper selection of material composition and doping concentration) so that it has energy level $E_{SC}$, with a high density of states, thereby pinning the Equilibrium Fermi level (EFL) at the surface SC to be at $E_{SC}$ which is above $E_{BM}$ in this case of n-type doping so that it satisfies $E_{SC}>E_{BM}$ $mk_BT_{OP}$ (with m>10) (compare with: $E_{SC}<E_{BM}-mk_BT_{OP}$, namely $E_{SC}$ below $E_{BM}$ in the case of p-type doping such as in FIG. 3A).

EFL is within the band gap of the barrier layer BL and passivation layer PL. The passivation layer PL is configured such that the EFL passes through its band gap, preferably such that its valence and conduction bands are each at least $10\,k_BT_{op}$ away from the EFL so that they do not contain enough carriers to conduct between the metal pads.

The EFL passes through the Fermi level of the photon absorbing layer, $E_{F(PAL)}$, so $E_{F(PAL)} = E_{SC}$. Therefore, noting first that minority holes tend to move to higher energy levels or "bubble-up" while minority electrons tend to move to lower energy levels or "roll down", then since most of the minority carriers from the PAL in both FIGS. 3A-3D and FIGS. 4A-4C have less than an energy $E_{BM}$ which is a significantly higher energy than $E_{F(PAL)} = E_{SC}$ (i.e., significantly greater than the EFL energy) they cannot conduct effectively at the surface, S of the BL, and electrical conduction through surface S is substantially reduced/prevented.

Turning now to FIG. 4B, the profiles of the energy bands of the device 600 along the cross-section line A-B, which passes through the metal contact MC, are shown when an operating bias voltage $V_{op}$ is applied via the metal contact.

As shown, in the device 600, similarly as in the device 500 described above, the energy band conducting minority carriers in the barrier layer BL (here it is the valence band since the layers are n-type) lies close to an energy band conducting the minority carriers (here the valence band) of the photon absorbing layer PAL. The minority carriers can thus pass freely from the photon absorbing layer PAL to the barrier layer BL. Accordingly, application of an operating bias voltage of a certain electric polarity will cause attraction of minority carriers from the un-depleted photon absorbing layer PAL to the metal contacts, thereby operating the photodetection function of the device 600. It is noted that also in the configuration of device 600 the detector dark current is substantially mainly/only due to diffusion of holes from the photon absorbing layer PAL, and that G-R currents from the photon absorbing layer and G-R processes in the barrier layer are suppressed because the photon absorbing layer is not depleted and because of the wide band gap of the barrier layer BL.

The following embodiments describe detector structures with an InAs/GaSb T2SL or InAs/InAsSb T2SL photon absorbing layer, PAL. The PAL is doped p-type because in such T2SL materials the electrons are more mobile and diffuse over longer distances in the superlattice growth direction than do the holes [08]. Therefore the devices are designed to operate with electron minority carriers (as opposed to hole minority carriers) in order to ensure that as many as possible of the minority carriers created by the absorption of light are collected.

Figure 5A:
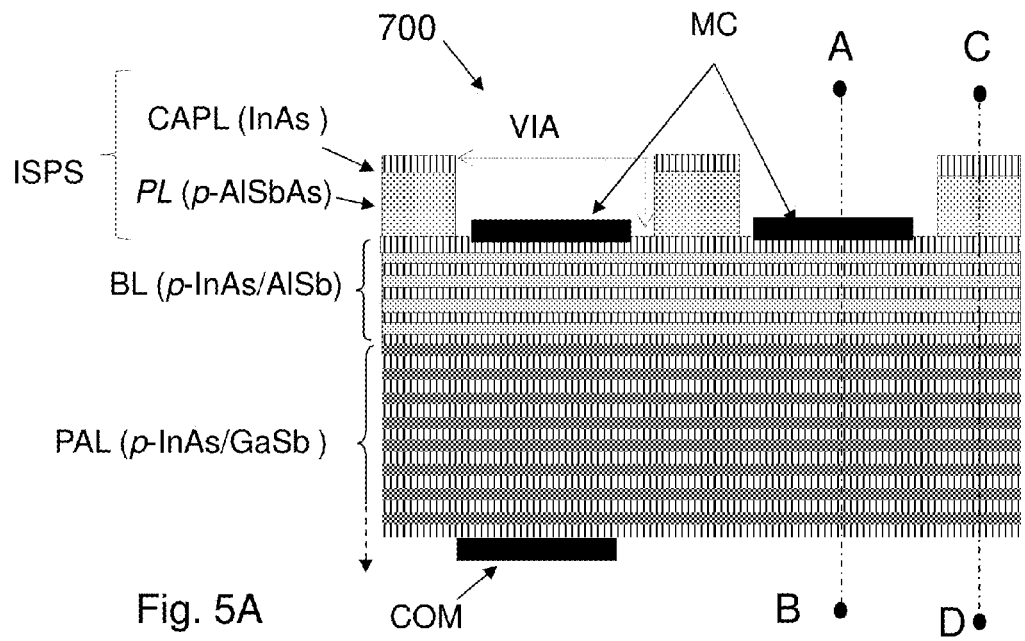
FIGS. 5A and 5B show schematically the configuration and energy band structure of a βBp semiconductor device configured and operable as a photo-detector device according to an embodiment of the present invention, in which the β-structure is made from a AlSbAs layer capped with a thin layer of InAs.

Reference is made to FIG. 5A depicting a βBp semiconductor device 700 similar to the device 500 of FIG. 3A described above, which is configured and operable according to an embodiment of the present invention as an infra-red light detector array. In this example, the photon absorbing layer PAL (only upper part is shown) and barrier layer BL are made from p-type InAs/GaSb and InAs/AlSb type II superlattices, respectively. Preferably the photon absorbing layer PAL is grown on a GaSb substrate (buffer layer/ substrate—not shown in this figure), and the barrier layer BL is grown thereon. An in-situ passivation structure ISPS is grown on top of the barrier layer BL. The in-situ passivation structure ISPS is comprised of two layers, PL and CAPL. The first passivation layer PL is a wide band gap layer that is grown on the barrier layer BL and is made from of p-type AlSbAs, preferably lattice matched to the barrier layer BL (e.g., and to the GaSb substrate). For instance the first passivation layer PL may be formed with material composition close to $AlSb_{0.91}As_{0.09}$. The second passivation layer CAPL in this example is a thin cap layer that is made from InAs.

The region along the cross-section line A-B illustrates the physical structure of a light sensitive pixel unit of the device 700 which is formed with a p-type photon absorbing layer. In certain embodiments of the present invention vias VIA, (whose approximate width and depth are shown by the horizontal and vertical dashed arrows in FIG. 5A) are etched through the passivation structure ISPS down to the barrier layer BL and metal contact pads MC are then deposited onto the exposed barrier layer BL. The metal pads MC fit inside the vias VIA and are separated from surfaces of the PL (AlSbAs) and the CAPL (InAs) layers of the passivation structure ISPS which are exposed by the etching process. For example, separating the metal pads MC from the passivation structure ISPS can be performed by carrying out a suitable photolithography fabrication process in which masks are used in conjunction with a photo-resist(s) to pattern the photoresist prior to etching the VIA openings, such that the VIA openings are correctly positioned and are larger than the size of the metal contacts MC, and the MC contacts are positioned (by a subsequent photoresist patterning process) to lie in the middle of the VIA openings. The metal contacts MC are fabricated with common process metals, such as chromium or titanium. It was shown experimentally that metal contacts with these metals exhibit a low resistance Schottky contact with the barrier layer BL, such that electrons can pass freely between the Fermi level of the metal, $E_{F(metal)}$, and the conduction band of the barrier, $E_C$. Indeed, in general, any metal with good adhesion properties might be used for a Schottky contact with the type II super-lattice (T2SL) barrier layer BL. However, use of metals with work functions significantly larger than vacuum level energy with respect to the conduction band of the barrier layer, will increase the operating bias. Therefore chromium or titanium are suitable because they each have a work-function of about 4.2-4.3 eV [16]. This is smaller than the conduction band energy of about 4.9 eV for the InAs/AlSb superlattice which is used for the BL (the vacuum level energy with respect to the conduction band of the barrier layer BL is very close to the depth of the GaSb valence band below the vacuum level, and the latter is given as 4.91 eV (at 300K) in Ref [17]. According to Ref. [16] most metals have a smaller work function than 4.91 eV).

The energy band structure (profiles of the conduction and valence bands) along the cross-section line A-B at the operating bias of the light sensitive pixel unit of the device 700 is similar to that described above with reference to FIG. 3B. The valence band of the light sensitive pixel unit is designed to have a large barrier energy $E_B$, and the conduction band, $E_C$, is designed to be smooth. This band alignment is achieved by configuring the superlattices of the photon absorbing layer PAL and the barrier layer BL with correct/ proper layer thicknesses respectively for both. For example, suitable layer thicknesses to achieve this band structure can be calculated by using for example the k·p method described in [12].

For example to achieve cut-off wavelengths of the T2SL photon absorbing layer above a wavelength of about 5 μm in the infra-red (IR) regime, the ratio of the barrier height energy ($E_B$) to the band gap energy of the photon absorbing layer ("the barrier height ratio") is expected to be larger than one. This cut-off wavelength range is ideal for IR detectors operating in the mid wave infra-red and/or in the long wave infra-red regimes (MWIR and LWIR) (approximately 2.9-5.4 μm and 8-14 μm, respectively). A "barrier height ratio" of greater than one ensures that thermionic emission of majority carriers from the photon absorbing layer PAL over the barrier BL is suppressed, in addition to suppression of the G-R current in the BL, because the activation energy in each case is greater than that for the diffusion limited current of the photon absorbing layer PAL. Therefore in this case the diffusion current constitutes the largest part of the dark current of the device (the dark current of the device is considered diffusion limited). The G-R current is also suppressed because there is no depletion in the narrow band gap photon absorbing layer PAL due to the p-doping of the barrier layer BL.

Figure 5B:
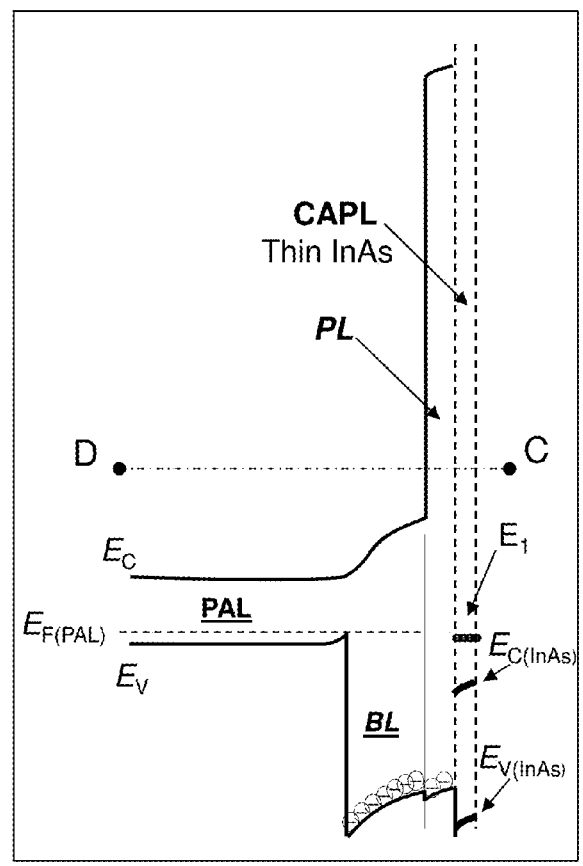

FIG. 5B shows the energy band structure (profiles of the conduction and valence bands) along the cross-section line D-C, which passes through the passivation structure ISPS between metal pads MC. The energy band structure shown here is similar to that described above with reference to FIG. 3D. In this example, because the cap layer CAPL is thin (e.g., of thickness about 5-20 nm), quantum confinement causes the first electron state, $E_1$, in the cap-layer material to lie typically 30-300 meV above the conduction band energy of bulk InAs, $E_{C(InAs)}$. This state thus constitutes the edge of a two dimensional conduction band in the cap layer CAPL. As indicated for example in [13], InAs grows with a "high density of surface states which normally lead to a conducting skin, which is formed by an electron accumulation layer". To this end the Fermi energy at the InAs surface of the cap layer CAPL is pinned just above the conduction band edge. In the present case it will be pinned very close to the energy $E_1$. Thus the equilibrium Fermi level along the line D-C passes from the Fermi level of the p-type photon absorbing layer PAL through the depleted barrier layer BL and the depleted passivation layer PL of the passivation structure ISPS and ends just above the energy level $E_1$ where it is pinned by the "high density of surface states" of the "conducting skin" of the cap layer CAPL of the passivation structure ISPS. The alignment of the band edges in FIG. 5B is based on the superlattice calculations described in [12] and the band edge energies for bulk AlSbAs given in [14].

As shown in FIG. 5B, the ionized acceptors (drawn as circles containing a "minus" sign) cause the bands to curve. Both the barrier layer BL and the wide band gap passivation layer PL are depleted, and along the line D-C the equilibrium Fermi level passes through their band gaps far from their band edges. Therefore both the passivation and barrier layers, PL and BL, provide good insulation between pixels (between the metal contacts MC).

In embodiments where the device 700 is configured and operable as an array detector (with plurality of pixels defined by plurality of the metal contacts MC), the cap layer CAPL (InAs) is maintained at the same potential as the common contact of the detector COM (COM is illustrated schematically in the FIG. 5A). Practically this is achieved by either a direct connection between the common contact COM and the cap layer CAPL (InAs), or by a few crystal defects (which essentially always exist in such structures) which cause a short circuit between the photon absorbing layer PAL (which is connected to COM) and the cap layer CAPL. To this end the passivation layer PL, which has a wide band gap and which is therefore electrically insulating, serves to isolate the cap layer CAPL such that it is not electrically connected to the metal contact MC. This provides that a bias can be applied between the metal contacts of each pixel MC and the common contact COM for proper detector operation (if MC was connected to CAPL which has a low resistance to PAL/COM no bias could be applied to the detector).

It should be noted that in addition to the above function of the cap layer CAPL, for pinning the equilibrium Fermi level at the surface of the ISPL and preventing leakage currents on the surface of the BL, the cap layer CAPL in the present example, which is made from InAs, has the additional advantage/function, that is to prevent/reduce damage of the passivation layer PL that may be caused by oxidation. In other words the InAs CAPL prevents/reduces oxidation of the AlSbAs material of the passivation layer PL (such oxidation might specifically occur during the detector fabrication process).

Yet another function/advantage of the cap layer CAPL, stems from the fact that the strong pinning of the equilibrium Fermi level to the band edge energy $E_1$, by the high density of surface states, stabilizes the band bending of the layers (e.g., BL) underneath the passivation structure PL, even when a glue under-fill is present, thereby preventing the EFL from approaching too close to a band edge in the BL or PL. To this end, the semiconductor device 700 depicted in FIG. 5A can be bonded to a silicon readout circuit (ROIC) ROIC, for example by using indium bumps and glue under-fill, and maintain its operation function as a detector.

An infra-red photo detector array device/sub-assembly 750 including the βBp semiconductor structure/device 700 depicted in FIG. 5A together with a ROIC electrically and mechanically coupled thereto, is illustrated for example in FIG. 5C. It should be understood that here a βBn structure of the present invention (such as that depicted in FIG. 4A) may also be used in the device/sub-assembly 750 instead of the βBp semiconductor structure 700. Here the semiconductor structure 700 of FIG. 5A is coupled to the ROIC via indium bumps IB which electrically couple the metallic contacts MC to corresponding contacts MCR of the ROIC, and glue under-fill GUF is present which fills the spaces between the ROIC and the semiconductor structure 700 between the indium bumps IB and mechanically reinforces the detector device 750. Also the substrate and buffer layers, SBS and BF, on which are grown the functional/device layers, PAL, BL, and ISPS, are shown in the figure. After the glue under-fill GUF is cured, the substrate SBS (which not necessarily exists in the final device 750) may be thinned (in some cases polished to the buffer layer BF). This is made possible by the use of the glue under-fill GUF which mechanically reinforces the semiconductor structure 700 and complete sub-assembly 750.

To this end after bonding the ROIC by the indium bumps, glue under-fill GUF is introduced (e.g., standard glue under-fill). As mentioned above, this occurs without significantly changing the band bending and equilibrium Fermi level position along the line D-C depicted in FIG. 5B, due to the strong pinning of the Fermi level at the surface of the cap layer (InAs) CAPL.

It is noted that another advantage of the technique of the present invention is that it allows in-situ fabrication of a relatively thin passivation layer PL (e.g., of the order of 20-200 nm). This is advantageous because it results in a very short vertical side-wall of the passivation layer PL (AlSbAs) exposed by etching the vias VIA. The small size of the exposed area of the PL (AlSbAs) minimizes any degradation of the exposed area by atmospheric oxidation. In addition, since the side-walls of the passivation layer PL are very short and may also be formed recessed, they do not experience the large stress/shear stress imparted by the glue under-fill on the surfaces of the detector array, especially parallel to the ROIC, after the bonded detector 750 is cooled to its operating temperature (after the fabrication and bonding). As mentioned above this stress, which is caused by the differences in the coefficients of thermal expansion of the silicon ROIC and the III-V semiconductors, (and possibly also the glue under-fill), can change the surface potential of a III-V semiconductor material, and this might result in a surface current leakage. However, in the present example, since only small stresses are imparted (due to the low profile of the side-wall of the passivation layer PL, and its vertical orientation), therefore, after bonded detector 750 is cooled to its operating temperature, it exhibits no significant surface leakage currents. To this end the largest component of the detector dark current is essentially the diffusion limited dark current from the photon absorbing layer PAL.

It is noted that the metal common contact COM is depicted in the figure schematically and in actual configuration of the device 750 it may be made at the edge of the pixel array of the device 750 from the upper side and joined by an indium bump or bumps to a common input of the ROIC (e.g., similar to the common contact COM depicted in FIG. 3A) and insulated (e.g., by an insulating dielectric) from all other layers of the semiconductor structure 700 except the photon absorbing layer PAL and the cap layer CAPL.

Figure 6B:
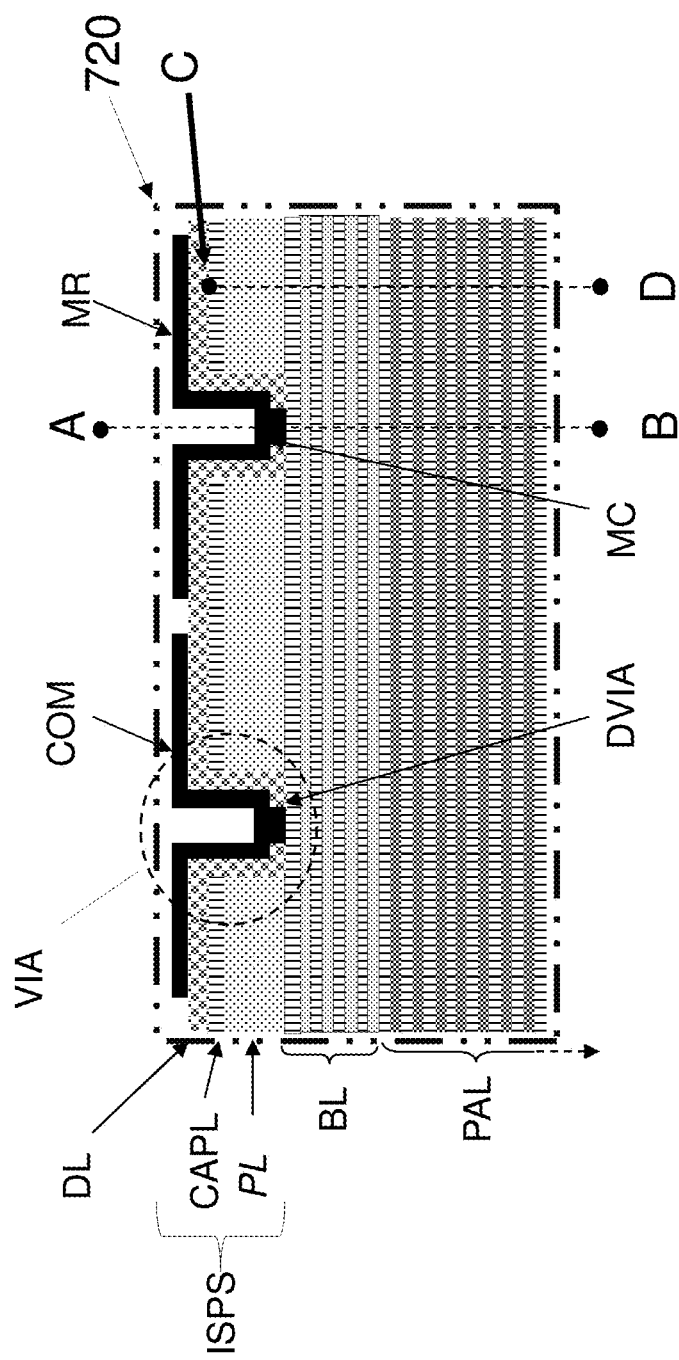

Reference is made to FIGS. 6A and 6B showing detector devices 760, 710 and 720 which are similar to the device 750 discussed in FIG. 5C above. Description of elements/structures of the devices 760, 710 and 720, which are similar to those of device 750 discussed above need not be repeated here with respect to devices 760, 710 and 720. In the example of devices 760, 710 and 720, reflective layer(s) (e.g., metal layers) are added above the cap layer CAPL to form reflective surfaces causing most radiation which passes the photon absorbing layer PAL towards them (and not absorbed by the photon absorbing layer PAL in the first pass), to be reflected back for a second pass through the photon absorbing layer PAL. This allows more photons to be absorbed by the photon absorbing layer PAL thus improving the sensitivity of the devices 760, 710 and 720.

In the example of device 710 shown in FIG. 6A a reflective layer MR (e.g., metal layer) is added on top of the cap layer CAPL. The reflective layer MR and possibly also the metal contacts MC at the bottom of each VIA, form reflective surfaces causing most radiation impinging thereon to be reflected back for a second pass through the photon absorbing layer PAL. The metal contacts MC at the bottom of each via may be deposited such that they extend over most of the bottom surface of the vias (e.g., over most of the exposed regions of the barrier layer BL) such that they reflect most of the radiation impinging on the bottom surface of the vias back for a second pass through the photon absorbing layer PAL. The reflective layer MR may deposited on/over the cap layer CAPL to have the same/similar dimensions as the cap layer CAPL after the vias VIA have been etched. The metal layer MR, and the metal contacts MC at the bottom of each via, can be made of the same metal or of different metals, but both are chosen to have good adhesion to the semiconductor surfaces and to have a high reflectivity at the operating wavelength of the detector. It is noted that there is negligible optical absorption in the barrier layer BL and in the passivation structure ISPS (because layer BL and PL have much larger band gaps than the photon absorbing layer PAL and layer CAPL is very thin). Accordingly the reflective metal layers MR and MC which direct the radiation for a second pass through the photon absorbing layer, together significantly increase the amount of light absorbed by the detector 760 (typically by 10-30%, depending on the dimensions of the vias and the thickness of the PAL) and hence increase its quantum efficiency. The device 720 shown in FIG. 6B is similar to device 700 of FIG. 5A. Here an insulating dielectric layer DL is deposited over the complete upper surface of the semiconductor device/structure 700 (over the cap layer CAPL and over the exposed regions of the passivation structure ISPS and barrier layer BL) after the vias VIA (in the description of this figure referred to as first vias) are etched and before the deposition of the metal contacts MC. Then, a second set of vias DVIA is opened through the dielectric layer DL over part of the lower level of the first vias VIA and a metal reflective layer MR is deposited over most of each pixel area of the detector 720 (e.g., over dielectric layer DL and the second vias DVIA). Optionally, the metal layer MR makes contact with the barrier layer BL that was exposed by the first and second vias, thereby forming the metal contacts MC. Alternatively, metal pads/contacts MC can be deposited onto the barrier layer BL before the encapsulation by the dielectric layer DL, so that the metal layer MR added after the encapsulation by the dielectric layer DL and the opening of the second vias DVIA makes contact with it. Preferably the metal used for the metal reflective layer MR (and any metal pads MC deposited after the first VIA) should have a high reflectivity for radiation in the operation wavelength of the device, and preferably the dielectric should be transparent to this radiation. This ensures that most of the radiation that is not absorbed by the photon absorbing layer PAL in its first pass therethrough will be reflected back for a second pass through the photon absorbing layer PAL. As indicated above, since there is negligible optical absorption in the barrier layer BL and in the passivation structure ISPS, the second pass will increase the amount of light absorbed by the detector 720 and increase its quantum efficiency.

Figure 6C:
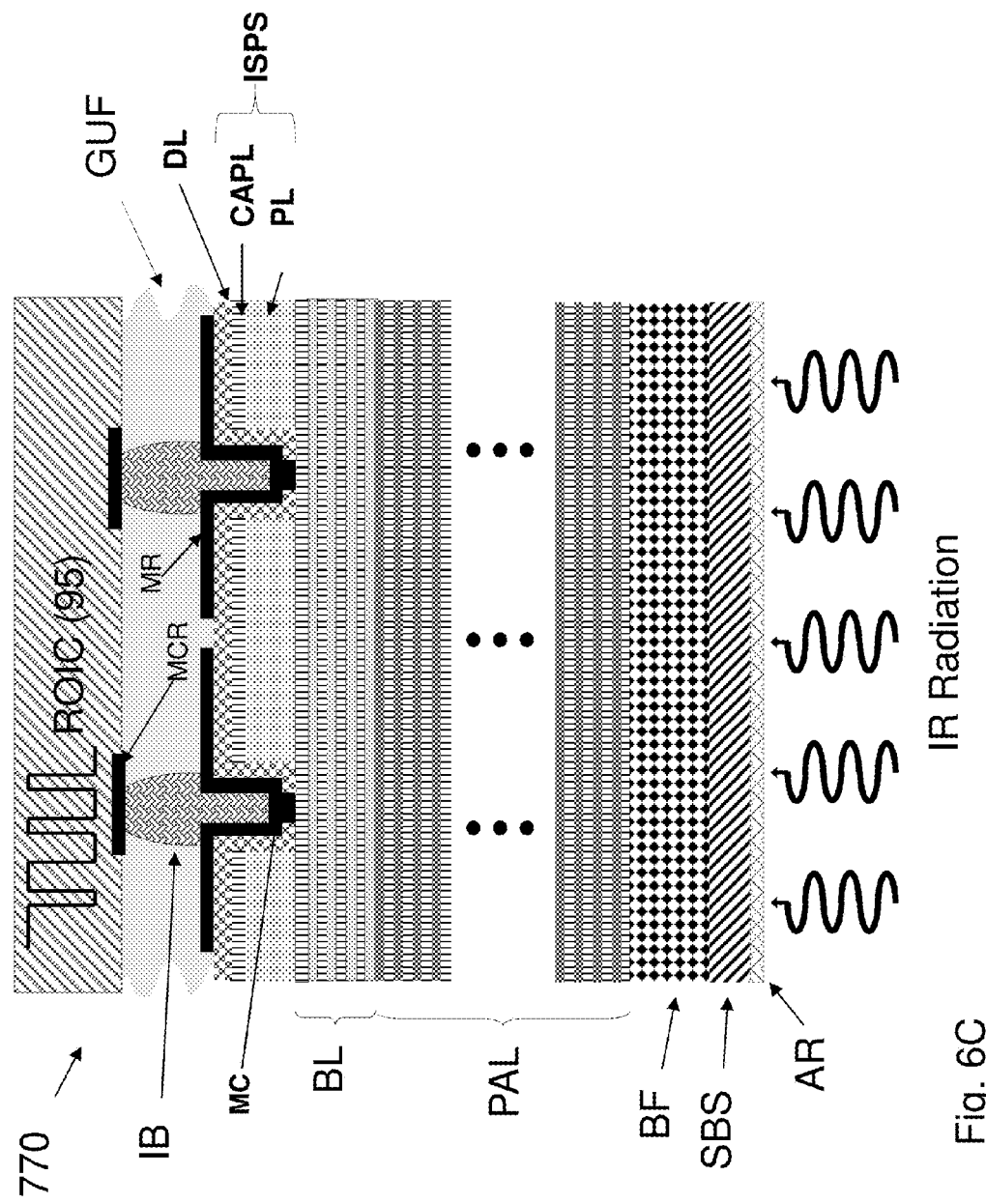

FIG. 6C shows a back-illuminated photodetector device 770 including a semiconductor device/structure similar to that of 720 depicted in FIG. 6B bonded to a silicon ROIC using indium bumps IB and glue under-fill GUF. In the detector 770, the bonding of the semiconductor device/structure 720 to the ROIC is made in a way as described above with reference to FIG. 5C. It is indicated that due to the strong pinning of the Fermi level at the cap layer CAPL, the energy band bending and position of the equilibrium Fermi level along the cross-section line D-C do not change significantly after bonding of the ROIC, the curing of the glue, and thinning of the substrate. Thus also here in detector 770 when the attached device 720 is cooled to its operating temperature, it exhibits an essentially diffusion limited dark current from the photon absorbing layer with no significant surface leakage currents.

It should be noted that in various embodiments of the invention in which glue under-fill is used, it is preferable to thin the device 750, 760, 770 (e.g., which may be configured as an IR photodetector array) by polishing or etching the substrate and possibly also parts of the buffer layers, SBS and BF, after the glue has been injected and cured. As already mentioned, this reduces the stress/shear stress on the surface of layers of the semiconductor structure 700, 710, 720 (containing type III-V semiconductor layers), which are caused due to differences in the coefficients of thermal expansion of the III-V detector materials of the semiconductor structure 700, 710, 720 (e.g., type III-V semiconductor materials) and the silicon ROIC. There may also be a force/stress on the surface of the layers of the semiconductor structure 700, 710, 720 (type III-V materials) due to differences in the thermal contraction of the glue and the indium bumps on cooling the detector. The more of the substrate SBS that is removed, the smaller are these forces/stresses. In addition, advantageously thinning the substrate can reduce the amount of the signal radiation absorbed by the substrate.

Thus at least for the above reasons in certain embodiments of the invention, the substrate SBS is etched or polished to a thickness of a few tens of microns, or less. In some cases the substrate SBS may be removed altogether and also part of the buffer layer BF. The buffer layer BF is attached to the rear of the photon absorbing layer PAL and has a wider band gap than the photon absorbing layer PAL. The buffer layer BF is usually grown first, before the photon absorbing layer PAL, in order to separate the surface of the substrate SBS, which may contain damage or contamination, from the edge of the photon absorbing layer PAL (e.g., the interface between the buffer layer BF and the photon absorbing layer PAL usually contains less damage and/or contamination than an interface of the PAL with the substrate SBS if the buffer layer were left out). Thus using the buffer layer prevents or significantly reduces premature recombination of minority carriers which may occur at the rear of the photon absorbing layer PAL due to Shockley-Read-Hall traps associated with the damage or contamination. The buffer layer is also designed so that it provides a barrier to minority carriers in the photon absorbing layer so that any of these carriers impinging on it are reflected back into the photon absorbing layer and do not escape.

After substrate thinning or removal, an anti-reflection coating AR is usually fabricated on the back of the detector 750, 760, 770 to ensure that most of the photons impinging on the detector are transmitted inside, towards the photon absorbing layer, and are not reflected away. In general, any suitable anti-reflective coating may be used in the invention. For example, in some embodiments of the invention, a conventional anti-reflection coating AR formed by a single uniform layer of a transparent dielectric of a suitable thickness, or by a stack of layers of more than one dielectric material designed according to the required anti-reflection performance, is used. In some embodiments, known in the art as sub-wavelength structures, such as pyramid arrays or other regular forms with the desired anti-reflecting properties, said sub-wavelength structures are etched into the remaining part of the buffer layer BF, substrate layer, or even into the photon absorbing layer (see [18]). In some cases the substrate layer SBS and/or the buffer layer BF may be removed altogether before fabricating a sub-wavelength anti-reflection structure or before depositing single or multi-layer anti reflective coatings AR. In such cases the anti-reflection structure or coating AR should also have the property of "back-side passivation" such that it reflects minority carriers impinging on it back into the photon absorbing layer without recombination.

Figure 7C:
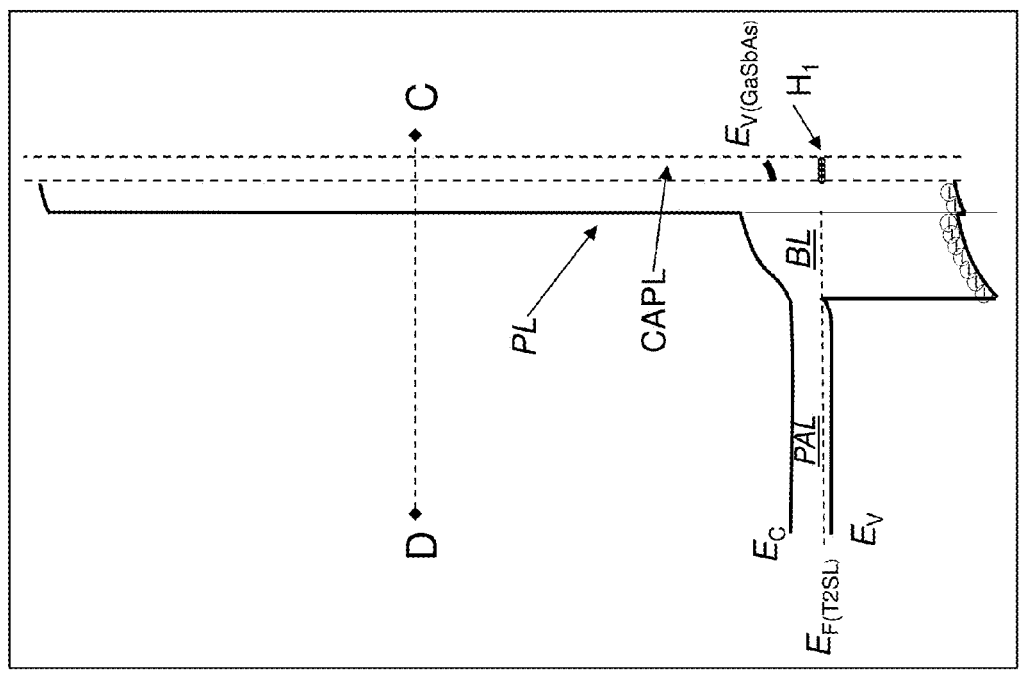

Reference is made together to FIGS. 7A-7C showing βBp semiconductor device/structure 800 configured and operable operative as an array photodetector according to another embodiment of the present invention. The energy band profiles of the device 800 at its operating bias along cross-section lines A-B and C-D are shown in FIGS. 7B-7C, having a similar semiconductor layer structure (including the photon absorbing layer PAL, the barrier layer BL, the passivation layer PL and cap layer CAPL) as in devices 500, 600 and 700 described above, but with different materials of the layers PAL, BL, and CAPL. Here the layers PAL, BL, and PL are all doped p-type (as in devices 500 and 700) described above and here CAPL is also doped p-type. The general band structure and function of PAL, BL, PL and CAPL is similar to that described above with reference to FIGS. 5A and 3A.

In this embodiment the photon absorbing layer PAL is made from a p-type InAs/InAsSb T2SL and the barrier layer BL is made from an InGaAlAsSb alloy whose major component is InAs. Preferably both are crystallized layers lattice matched to a GaSb substrate. As shown in FIGS. 7B and 7C, these materials of the photon absorbing layer PAL and the barrier layer BL exhibit a nearly smooth conduction band profile $E_C$ (allowing the free flow of minority carriers (electrons) from the p-type PAL to the p-type BL), and a large barrier energy, $E_B$, in the valence band. The "barrier height ratio" is greater than one for photon absorbing layers with band gaps corresponding to both the LWIR and MWIR wavelength ranges.

The in-situ passivation structure ISPS has the same first wide band gap crystallized passivation layer PL as in device 700 described above, which is made from p-type AlSbAs, preferably $AlSb_{0.91}As_{0.09}$ so that it is closely lattice matched with the rest of the structure (e.g., to the barrier layer BL on which it is grown). The second layer CAPL of the in-situ passivation structure ISPS is a thin crystallized cap layer made/grown from p-type GaSbAs or a semiconductor alloy whose major component is GaSbAs. As illustrated in FIG. 7C, the first confined hole state, $H_1$, in the thin cap layer CAPL constitutes the top of a two dimensional valence band. Thus the equilibrium Fermi level between metal pads along the line DC passes from the Fermi level, $E_{F(T2SL)}$, of the p-type photon absorbing layer PAL through the depleted barrier layer BL and the depleted passivation layer PL and ends just below the energy level $H_1$ where it is pinned by a high density of surface states in the two dimensional valence band of the cap layer CAPL (just below the bulk valence band edge in the GaSbAs cap layer CAPL material, $E_{V(GaAsSb)}$. This stabilizes the band alignment even when a glue under-fill is present. The passivation layer PL (AlSbAs) and the barrier layer BL (InAs or InGaAlAsSb layers) are fully depleted with negatively charged acceptors indicated by a circle around a "minus" sign.

The equilibrium Fermi level (marked by the dashed line) is far from the band edges of the barrier layer BL and the passivation layer PL, so both layers provide good insulation between pixels (between the metal contacts MC defining the pixels). When the device 800 is operated as an array photodetector, the GaSbAs cap layer CAPL is maintained at the same potential as the common contact (not specifically shown in the figure) since it is either connected to it directly or because a few crystal defects always exist that cause a short circuit between the photon absorbing layer PAL and the cap layer CAPL, and PAL is connected to the common contact. The cap layer CAPL, however, is not connected to the metal contacts MC, and is isolated from these contacts by the insulating wide band gap passivation layer PL. The GaSbAs cap layer CAPL also prevents/protects the insulating AlSbAs wide band gap passivation layer PL from being damaged by oxidation during the detector fabrication process.

Although not shown in the figure, the semiconductor structure/device 800 can be bonded to a silicon ROIC (e.g., using indium bumps) in a similar way as illustrated and described above, for example with reference to FIG. 5C (e.g., here the cap layer CAPL of FIG. 5C is replaced by a GaSbAs layer CAPL). As described above with reference to FIG. 5C standard glue under-fill can be introduced between the indium bumps after the glue is cured, the substrate and possibly also the buffer layer, on to which the layers PAL, BL and PL are grown (not specifically shown in the figure) can be thinned (by polish or etching). For the same reasons as discussed above, the introduction and curing of the glue under-fill as well as the thinning of the substrate and/or buffer layers do not change the band bending and equilibrium Fermi level position along the line D-C enough to cause leakage between pixels/contact pads MC. Also here, the vertical side-walls of the passivation layer PL that are exposed by etching the vias VIA can be made very short/ shallow (due to the small thickness of the crystallized passivation layer PL and the cap CAPL layers) and are recessed. Accordingly, degradation of the exposed side-wall area by atmospheric oxidation is minimized, and the semiconductor side-walls do not experience a large stress/shear stress imparted by the glue under-fill so the structure of their bands at the side-wall surface is not strongly affected by such stress. Accordingly at the operating temperature, the detector device (including the semiconductor structure bonded to the ROIC) exhibits an essentially diffusion limited dark current from the photon absorbing layer with no significant surface leakage currents.

FIG. 8A shows another example of the βBp semiconductor device/structure 900 of the present invention, in which the passivation structure ISPS includes a single passivation layer PL made by in-situ growth of a thin layer of aluminum oxide on the top surface of a barrier layer BL. The semiconductor device 900 has a semiconductor layer structure, including p-type photon absorbing layer PAL and p-type barrier layer BL, which operate functionally and are configured with energy band profiles similar to those devices 500 and 700 described above. In this example, the photon absorbing layer PAL includes a crystallized InAs/GaSb superlattice (T2SL), which was grown on a substrate layer or a buffer layer (not specifically shown), and the barrier layer BL includes a crystallized p-type InAs/AlSb superlattice (T2SL) which was grown on the photon absorbing layer PAL.

In this example, the single passivation layer PL of the in-situ passivation structure ISPS is an amorphous/non crystalline layer, produced by growing a small number of monolayers (typically 2-10) of aluminum in situ (without taking the layer structure from the growth machine) on top of an InAs/AlSb barrier layer BL. The aluminum is then oxidized to form amorphous/non crystalline aluminum oxide, which has a wide band gap as required for in-situ passivation. This passivation, made by the in-situ deposited aluminum which is subsequently converted to aluminum oxide, is an insulator with a very large band gap which may stabilize the pinning of the equilibrium Fermi level so that it passes through the band gap of the barrier layer BL in regions between the metal pads MC (far from the band edges). In regions where the metal contact pads MC are deposited, the aluminum oxide is first removed by etching vias through it. Although the aluminum oxide is an amorphous/non crystalline material, the method of its fabrication by the in-situ deposition of aluminum in the growth reactor and subsequent oxidation results in a very uniform material which has a very clean/uncontaminated interface with the InAs/AlSb BL.

FIG. 8B shows the profiles of the conduction and valence energy band edges, $E_C$ and $E_V$, along the cross-section line A-B when the device 900 is at its operating bias.

FIG. 8C shows profiles of the conduction and valence band edges, $E_C$ and $E_V$, along the cross-section line DC'. The equilibrium Fermi level (EFL) passes through the Fermi level of the PAL, $E_{F(PAL)}$, and is shown pinned in the band gap region of the aluminum oxide passivation layer PL at a position far from the conduction and valence band edges of the barrier layer BL. The InAs/AlSb barrier layer BL is fully depleted. Negatively charged acceptors are indicated by a circle around a "minus" sign.

In various embodiments of the present invention, the device 900 is configured as a photo-detector array and includes a plurality of metal pads defining pixels of a photo-detector array. The device 900 can be bonded to a silicon ROIC using indium bumps in a similar way as described above. Glue under-fill may be introduced between the indium bumps. The substrate of this device on which the layers are grown can also be thinned, as for the other embodiments described above.

It should be noted that various embodiments of the invention, such as those described above may be implemented with no glue under-fill between the indium bumps connecting the ROIC or else with a weak glue under-fill which has no effect on the surface potential of the barrier layer BL. As indicated above with reference to FIGS. 2C-2F, in the absence of an under-fill, the surface of the barrier layer BL does not exhibit strong leakage currents. A typical band profile for such a case is shown in FIG. 2E. Thus, if no under-fill is to be used, the layers of the passivation structure ISPS can be made from the same material as the barrier layer BL. For example, the layers of the barrier layer BL and the passivation structure ISPS can be made from InAs/AlSb material which has a wide band gap suitable for the barrier layer BL. Also the vias can be very shallow or even zero depth. In embodiments of the present invention in which the semiconductor device, such as device 500 of FIG. 3A are configured in such a way (i.e., without using glue under-fill and with the barrier layer BL and passivation structure ISPS made from the same InAs/AlSb material and with shallow or zero via depth), the simplest embodiment is when the metal contact pads MC sit directly on the unetched surface of the barrier layer BL. The barrier layer and the photon absorbing layer PAL are of the same doping polarity (p-type).

FIG. 9A schematically illustrates such a device 1000 including a p-type barrier layer BL grown on top of a p-type photon absorbing layer PAL. The PAL is formed with InAs/GaSb T2SL material and the BL is formed with InAs/AlSb T2SL material. Metal pads MC are attached directly to the surface of the barrier layer BL. The device 1000 shown in this figure operates satisfactorily as a photodetector when it is coupled to the ROIC without using glue under-fill. In this case it does not exhibit strong leakage currents on the surface of the barrier layer BL. FIG. 9B shows the profiles of the conduction $E_C$ and valence $E_V$ band edges along the line A-B when the device is at its operating bias. In FIG. 9C the conduction $E_C$ and valence $E_V$ band edge profiles are shown along the line D-C', where the surface S of the barrier layer BL is at equilibrium with the bulk photon absorbing layer so that the equilibrium Fermi level passes through the Fermi level of the PAL, $E_{F(PAL)}$, and continues to the surface S where it is pinned at an energy slightly below the conduction band, corresponding to the case of no glue under-fill.

It is noted that such a device as shown in FIG. 9A is different from the mBn devices disclosed in U.S. Pat. No. 4,679,063 because it has the opposite doping polarity of the photon absorbing layer (p-type vs. n-type in the conventional mBn devices), so that both the photon absorbing layer, PAL, and the barrier layer, BL, have the same (p-type) doping polarity and the photon absorbing layer is not therefore depleted so that G-R dark current therefrom is suppressed. In the conventional mBn devices (e.g., see U.S. Pat. No. 4,679,063) the barrier and photon absorbing layer have respectively opposite doping polarities, p-type and n-type respectively which sources significant G-R currents from the photon absorbing layer. Yet additionally, and differently from the conventional mBn device, in the present embodiment, the barrier layer BL of the device 1000 is made from a superlattice material. This is advantageous because it can be made from III-V InGaAlSbAs materials grown on commercial GaSb or other III-V substrates, and because these materials, unlike HgCdTe (discussed above with reference to [15]) can be configured to provide a smooth band profile for minority carriers.

Since the barrier layer BL does not need to be etched (i.e., there is no need to form mesa structures or vias), the surface of the barrier layer BL, which is never in contact with an etching process, is very uniform so the image in the photo-detector device fabricated in this way does not suffer from the spatial fluctuations such as those that do occur with conventional superlattice based pBp devices in which mesas are etched (this has been verified in laboratory tests). These fluctuations are related to small variations of the surface potential, depending on whether the etch stops in an InAs or an AlSb layer of an InAs/AlSb T2SL BL. Since the surface produced by the etch process is never atomically flat, both materials are generally exposed.

The invention claimed is:

1. A photo-detector, comprising:
   a photon absorbing layer comprising a semiconductor material having a first energy band gap;
   a barrier layer comprising a second semiconductor material having a second energy band gap;
   a passivation structure comprising at least one layer located on said barrier layer and having a third energy band gap;
   one or more metal contacts defining pixels of said photo-detector are electrically coupled to said barrier layer at exposed regions of the barrier layer, at which said passivation structure is absent; and
   wherein said passivation structure comprises a material having a high density of surface states thereby forcing pinning of an equilibrium Fermi level of said passivation structure to be within said third energy band gap and away from conduction and valence bands of the barrier layer, thereby reducing surface leakage and preventing electrical conduction between the one or more metal contacts defining the pixels of said photo-detector.

2. The photo-detector according to claim 1 wherein said at least one layer of the passivation structure is grown in-situ on said barrier layer.

3. The photo-detector according to claim 1 configured according to at least one of the following:
   (i) the semiconductor materials of said photon absorbing layer and said barrier layer are doped with a certain similar doping polarity resulting in no depletion of said photon absorbing layer thereby suppressing G-R current from said photon absorbing layer and enabling a diffusion limited dark current in said photo-detector;
   (ii) said second energy band gap is larger than said first energy band gap such that application of an operating bias voltage of a certain electric polarity to said one or more metal contacts causes attraction of minority carriers from said un-depleted photon absorbing layer across depleted regions of the barrier layer to said one or more metal contacts;
   (iii) said second energy band gap of the barrier layer is substantially larger than said first energy band gap of the photon absorbing layer to reduce G-R processes in the barrier layer and thereby suppress dark G-R current from said barrier layer; thereby enabling a diffusion limited dark current in said photo-detector; or
   (iv) an energy band conducting minority carriers in the barrier layer lies close to an energy band conducting the minority carriers in said photon absorbing layer such that said minority carriers can pass from said photon absorbing layer.

4. The photo-detector according to claim 3, further comprising a buffer layer located next to the photon absorbing layer, from a side opposite to said barrier layer, whereby said buffer layer is transparent to photons in the operation spectral range of the photo-detector and is configured to reflect minority carriers to prevent them from escaping from the photon absorbing layer.

5. The photo-detector according to claim 1 configured according to at least one of the following:
   (i) said photon absorbing layer comprises III-V semiconductor materials;
   (ii) said photon absorbing layer comprises a superlattice structure comprising a plurality of repeated superlattice units formed with different compositions of InGaAlAsSb materials;
   (iii) said barrier layer comprises III-V semiconductor materials;
   (iv) said barrier layer comprises a superlattice structure comprising a plurality of repeated superlattice units formed with different compositions of InGaAlAsSb materials; or
   (v) said photon absorbing layer having said first energy band gap and said barrier layer having said second energy band gap comprise respectively different compositions of III-V semiconductor materials thereby forming a hetero-junction between them.

6. The photo-detector according to claim 1 wherein said at least one layer of the passivation structure, which is located on said barrier layer, comprises at least one of the following: a bulk alloy and a superlattice structure.

7. The photo-detector according to claim 1 wherein said at least one layer of the passivation structure, which is located on said barrier layer, comprises a III-V semiconductor material comprising at least one of the following: a bulk alloy, or a superlattice structure comprising a plurality of repeated superlattice units formed with different compositions of III-V semiconductor materials.

8. The photo-detector according to claim 7 wherein said III-V semiconductor material of the passivation structure having said third energy band gap has a different composition than a III-V semiconductor material composition of the barrier layer having said second energy band gap.

9. The photo-detector according to claim 1 wherein said one or more metal contacts coupled to the barrier layer form a Schottky junction/contact that collects minority carriers leaving the barrier layer.

10. The photo-detector according to claim 1 wherein said at least one layer of the passivation structure is a crystallized layer grown in-situ on the barrier layer and lattice matching with the barrier layer.

11. The photo-detector according to claim 1 wherein the passivation structure comprises one thin layer of aluminum oxide made by in-situ deposition in the growth chamber of up to ten monolayers of aluminum on top of the barrier layer, followed by oxidation of the aluminum into aluminum oxide after removal from the growth chamber.

12. The photo-detector according to claim 1 wherein the passivation structure has a similar material to the barrier layer, thereby obviating a need for further passivation of exposed surfaces of the passivation structure and enabling obviating the use of vias or allowing utilization of shallow vias with reduced depth.

13. The photo-detector according to claim 1 wherein the passivation structure includes a cap layer comprising said material having said high density of surface states, and wherein said material in the cap layer comprises a thin bulk layer of InGaAlSbAs.

14. The photo-detector according to claim 13 wherein the cap layer has a thickness in a range of 0.004 to 0.1 μm and is a binary or alloy semiconductor material having a major component including at least one of the following materials: InAs, GaSb, or GaSbAs.

15. The photo-detector according to claim 1, further comprising one or more reflective material layers configured to reflect most of the radiation impinging thereon back for a second pass through the photon absorbing layer, and wherein said one or more reflective material layers comprise one or more of the following:
   (i) a reflective layer located on said passivation structure for reflecting radiation impinging thereon back for a second pass through the photon absorbing layer;
   (ii) one or more of said one or more metal contacts, whereby said one or more metal contacts are optically coupled to the exposed regions of the barrier layer such that said one or more metal contacts reflect most of the radiation impinging thereon back for a second pass through the photon absorbing layer; or
   (iii) a metal material of said one or more metal contacts that is configured to extend on top of a dielectric material covering a large portion of the pixel area thereby enabling reflection of most of the radiation impinging on it back for a second pass through the photon absorbing layer.

16. The photo-detector according to claim 1, further comprising a stack of the following layers in the following order: said photon absorbing layer, said barrier layer, and said passivation structure; and wherein said stack of layers are grown in-situ, by an epitaxial growth method.

17. The photo-detector according to claim 1 wherein the photon absorbing layer, said barrier layer, and said first layer of the passivation structure comprise p-type semiconductor materials.

18. A method for passivating a crystallized layer of a semiconductor device being one of a superlattice layer or a layer of group III-V semiconductor materials; the method comprising:
   depositing one or more layers of a passivation structure;
   wherein said depositing comprises growing at least one passivation layer in-situ in a growth chamber, on top of said crystallized layer of the semiconductor device, being at least one of a superlattice layer or a layer of group III-V semiconductor materials; and
   fabricating material having a high density of surface states that forces surface pinning of an equilibrium Fermi level to lie within a certain band gap of the crystallized layer of the semiconductor device which is passivated and away from its conduction and valence bands.

19. The method of claim 18 wherein said at least one passivation layer is grown in crystallized form on top of the said crystallized layer of the semiconductor device, such that said at least one passivation layer is lattice matched with said crystallized layer and has a fixed band alignment with said crystallized layer of the semiconductor device.

20. The method of claim 18 wherein said fabricating of the material having the high density of surface states comprises one of the following:
   (i) oxidizing said passivation layer such that it becomes a non-crystalline layer serving also as a cap layer including said material having the high density of surface states; or
   (ii) growing a cap layer in-situ in a growth chamber, on top of said passivation layer, wherein said cap layer comprises said material having the high density of surface states in a crystallized or non-crystalline form.

21. The method of claim 18, further comprising:
   etching said passivation structure to expose regions of said crystallized layer at which said one or more metal contacts are to be located and depositing metal material at said exposed regions to form said one or more metal contacts; and
   wherein said passivation structure prevents or suppresses conduction of electric current between said one or more metal contacts.

22. A semiconductor device, comprising:
   a device layer comprising a crystallized layer being at least one of a superlattice layer or a layer of group III-V semiconductor materials; and
   a passivation structure comprising one or more layers; wherein:
      at least one of said one or more layers of the passivation structure includes a passivation layer grown in-situ in a growth chamber on top of said device layer; and
      at least one of said one or more layers of the passivation structure includes material having a high density of surface states that forces surface pinning of an equilibrium Fermi level within a certain band gap of the device layer, away from its conduction and valence bands.

23. The semiconductor device of claim 22 wherein said passivation layer is oxidized, thereby becoming a non-crystalline layer serving also as a cap layer including said material having the high density of surface states.

24. The semiconductor device of claim 22, further comprising, in addition to said passivation layer, a cap layer comprising said material having the high density of surface states, wherein said cap layer is a crystallized or non-crystalline layer, deposited on top of said passivation layer of the passivation structure.

* * * * *